(12) United States Patent
Brock et al.

(10) Patent No.: US 8,146,756 B2
(45) Date of Patent: Apr. 3, 2012

(54) UNIVERSAL TOOLLESS RACK MOUNT BRACKET

(75) Inventors: Patty J. Brock, Irvine, CA (US); Ramiro Perez, Santa Ana, CA (US)

(73) Assignee: Jonathan Manufacturing Corporation, Irvine, CA (US)

( * ) Notice: Subject to any disclaimer, the term of this patent is extended or adjusted under 35 U.S.C. 154(b) by 1010 days.

(21) Appl. No.: 12/106,145

(22) Filed: Apr. 18, 2008

(65) Prior Publication Data
US 2008/0296455 A1 Dec. 4, 2008

Related U.S. Application Data

(60) Provisional application No. 60/912,651, filed on Apr. 18, 2007.

(51) Int. Cl.
*A47B 57/00* (2006.01)
(52) U.S. Cl. ........................................... 211/192
(58) Field of Classification Search .................. 211/192, 211/175, 191, 190, 151, 26, 187; 248/220, 248/220.1; 312/334.5, 223.2
See application file for complete search history.

(56) References Cited

U.S. PATENT DOCUMENTS

| | | | |
|---|---|---|---|
| 5,571,256 A | 11/1996 | Good et al. | |
| 5,833,337 A * | 11/1998 | Kofstad ..................... | 312/334.5 |
| 6,021,909 A | 2/2000 | Tang et al. | |
| 6,099,098 A | 8/2000 | Leong | |
| 6,269,959 B1 | 8/2001 | Haworth | |
| 6,422,399 B1 | 7/2002 | Castillo et al. | |
| 6,554,142 B2 | 4/2003 | Gray | |
| 6,615,992 B1 | 9/2003 | Lauchner et al. | |
| 6,622,873 B2 | 9/2003 | Hegrenes et al. | |
| 6,626,300 B2 | 9/2003 | Kaminski et al. | |
| 6,648,149 B2 | 11/2003 | Robertson | |
| 6,702,124 B2 * | 3/2004 | Lauchner et al. ............... | 211/26 |
| 6,840,388 B2 | 1/2005 | Mayer | |
| 6,866,154 B2 | 3/2005 | Hartman et al. | |
| 6,891,727 B2 | 5/2005 | Dittus et al. | |
| 6,948,691 B2 * | 9/2005 | Brock et al. ............. | 248/222.13 |
| 7,192,103 B2 | 3/2007 | Hamilton | |
| 7,453,698 B2 * | 11/2008 | Cox et al. ...................... | 361/726 |
| 7,731,142 B2 * | 6/2010 | Chen et al. .................... | 248/244 |
| 7,810,653 B2 * | 10/2010 | Schmidtke et al. ............. | 211/26 |
| 7,934,607 B2 * | 5/2011 | Henderson et al. ............. | 211/26 |
| 2002/0074915 A1 | 6/2002 | Shih | |
| 2004/0120106 A1 | 6/2004 | Searby et al. | |
| 2004/0189161 A1 | 9/2004 | Davis et al. | |
| 2004/0189162 A1 | 9/2004 | Davis et al. | |
| 2004/0217073 A1 * | 11/2004 | Dobler et al. ................... | 211/26 |
| 2005/0156493 A1 | 7/2005 | Yang et al. | |
| 2005/0274680 A1 | 12/2005 | Allen et al. | |

FOREIGN PATENT DOCUMENTS

GB 2 353 205 2/2001

* cited by examiner

*Primary Examiner* — Sarah Purol
(74) *Attorney, Agent, or Firm* — Knobbe, Martens, Olson & Bear LLP

(57) ABSTRACT

A bracket for connecting a slide assembly to a rack having any one of multiple hole standards. The bracket includes a first portion defining a first surface that contacts the rack and a second portion that defines a second surface that contacts the rack. The first portion and the second portion cooperate to capture a portion of the rack therebetween. The bracket further includes a first projection sized and shaped to engage a first rack hole standard and a second projection sized and shaped to engage a second rack hole standard. The bracket may also include additional projections configured to engage additional hole standards.

19 Claims, 18 Drawing Sheets

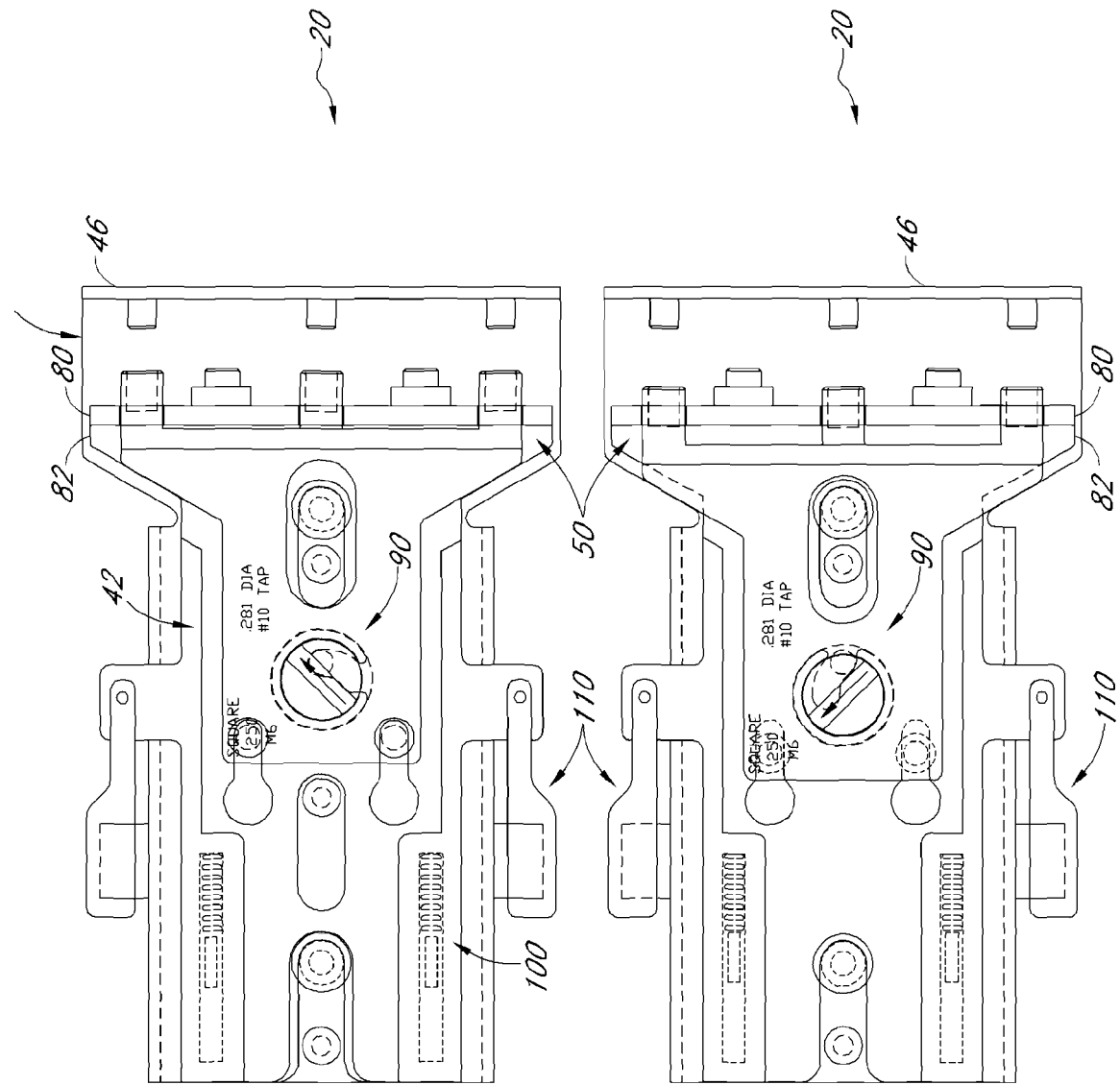

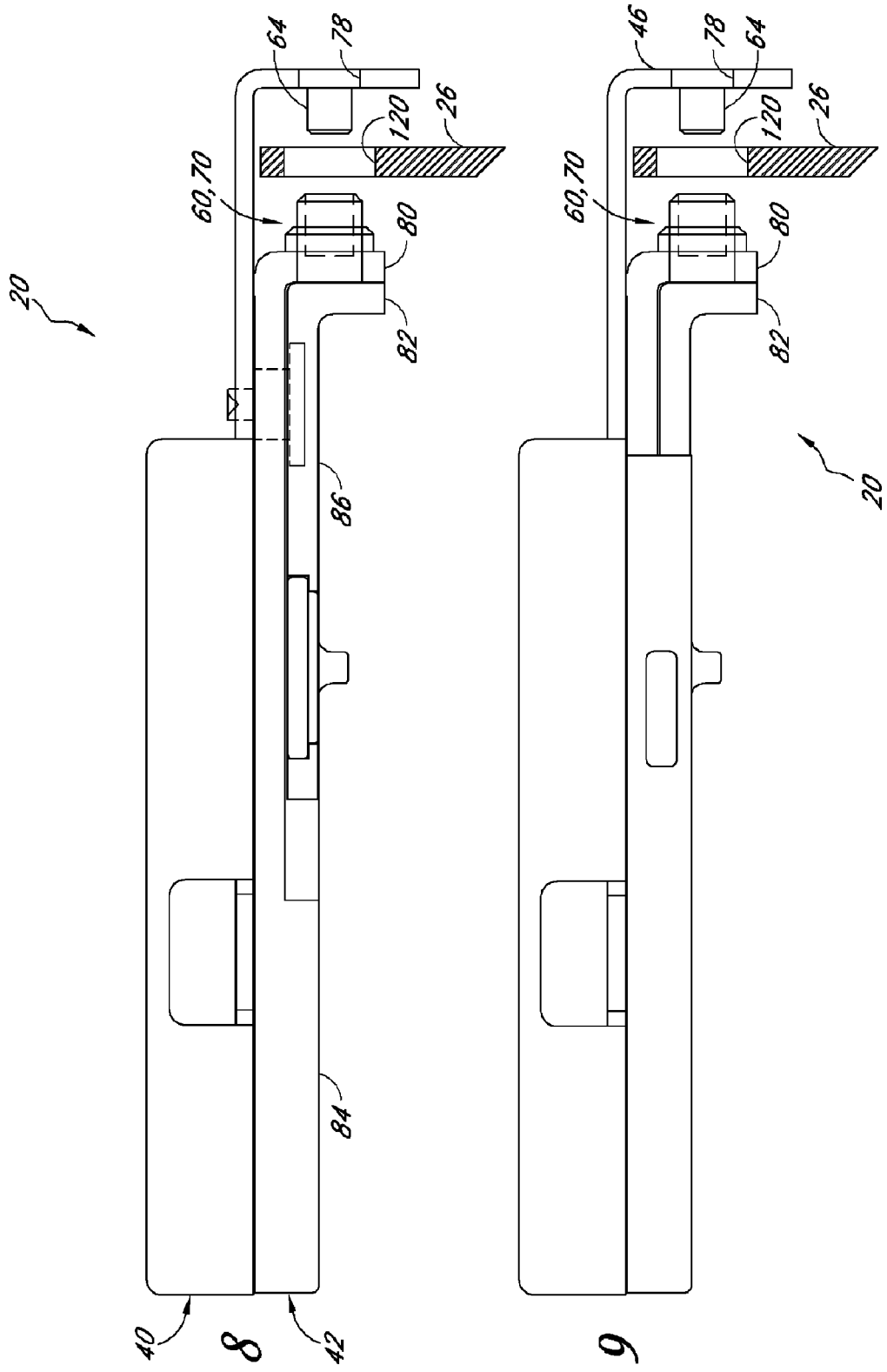

UNIVERSAL TOOLLESS RACK MOUNT BRACKET

CROSS-REFERENCE TO RELATED APPLICATIONS

This application claims the priority benefit under 35 U.S.C. §119(e) of U.S. Provisional Application No. 60/912,651, filed Apr. 18, 2007, which is hereby incorporated by reference in its entirety.

BACKGROUND

1. Field of the Inventions

The present application relates generally to mounting structures for slide assemblies or other movable or stationary trays, compartments or members. More particularly, the present invention relates to a toolless mount bracket for a slide assembly.

2. Description of the Related Art

Slide assemblies are often used to support a computer server within an enclosure or rack. The slide assembly permits the server to be extended from the rack to promote access to the server for maintenance, replacement or the like. The server enclosure or rack typically includes a vertical support rails at each corner. A pair of slide assemblies are mounted to the vertical support rails on opposing sides of the enclosure. The pair of slide assemblies movably support opposing sides of a computer server.

The vertical support rails of the server rack typically include a plurality of openings, or mounting holes, spaced along the height of the support rail, which permit the slide assemblies to be coupled to the vertical support rails at any of a number of possible locations. Typically, a bracket will be connected to each end of the slide assembly and act as an interface between the slide assembly and the vertical support rails of the rack. However, multiple standards of the mounting holes of the vertical supports are currently in use. Accordingly, the appropriate brackets must be selected for use with a specific server enclosure or rack. Such a situation is troublesome for manufacturers or suppliers of slide assemblies because a number of brackets must be kept on hand and provided for any particular order. As a result, manufacturing or inventory costs are increased, and the possibility exists of providing the wrong brackets for a particular order.

SUMMARY

According to one embodiment of the present application, a bracket for connecting a slide assembly, drawer, another movable or stationary compartment, tray, shelf or member and/or the like to a frame member having a plurality of openings includes a first portion defining a first surface that is configured to contact the frame member and a second portion defining a second surface that is configured to contact the frame member. The first portion is connected to a slide assembly, and the second portion being movable relative to said first portion. The first portion and the second portion cooperate to capture a section of the frame member therebetween. Further, the bracket includes a first projection generally extending between the first surface and the second surface and a second projection extending between the first surface and the second surface. The first projection is adapted to engage a first rack hole standard, and the second projection is adapted to engage at least a second rack hole standard.

In some embodiments, the application discloses a bracket for connecting a slide assembly to a rack having any one of multiple hole standards. The bracket includes a first portion and a second portion such that the first portion and the second portion cooperate to capture a portion of the rack therebetween. The second portion additionally includes a first section and a second section movable relative to the first section between at least a first position and a second position. The bracket is configured to accommodate a first rack hole standard when the first section is in the first position. Further, the bracket is configured to accommodate a second rack hole standard when the first section is in the second position.

According to some embodiments, a method of securing a slide assembly to a frame member includes providing a bracket member having a first portion and a second portion. The first portion includes a flange, and the second portion includes a head. The flange of the first portion and the head of the second portion cooperate to capture a portion of the frame member therebetween. The bracket is configured to accommodate a first hole standard of the frame member when the head of the second portion is in a first position. Likewise, the bracket is configured to accommodate a second hole standard of the frame member when the head of the second portion is in a second position. Further, the head of the second portion is movable between the first position and the second position using a selector member. The method further includes utilizing the selector member to move the head to the first or second positions depending on a hole standard of the frame member and aligning the bracket along a desired location of the frame member. In addition, the method includes capturing the frame member between the flange and the head by moving the first portion or allowing the first portion to move relative to the second portion.

One aspect of a preferred embodiment of the present invention involves a rack mount bracket for a slide assembly that is adapted for use with multiple rack mount standards. Preferably, a preferred embodiment of the present rack mount bracket is capable of use with all five of the currently popular rack mount standards for computer server racks. Preferably, the rack mount bracket is a toolless bracket that permits a slide assembly incorporating such rack mount brackets to be installed into a server rack without the use of tools. In some arrangements, the bracket includes a latch to secure the bracket to the mount rail after installation.

BRIEF DESCRIPTION OF THE DRAWINGS

These and other features, aspects and advantages of the present invention are described below with reference to drawings of preferred embodiments of the invention, which are intended to illustrate but not to limit the present invention. The drawings contain twenty-two (22) figures.

FIG. 6 is a side view of the rack mount bracket of FIGS. 1-5 in the first orientation.

FIG. 7 is a side view of the rack mount bracket of FIGS. 1-5 in the second orientation.

FIG. 8 is a first cross-sectional view of the rack mount bracket of FIGS. 1-7.

FIG. 9 is a second cross-sectional view of the rack mount bracket of FIGS. 1-7.

DETAILED DESCRIPTION OF THE PREFERRED EMBODIMENTS

Figure 1:
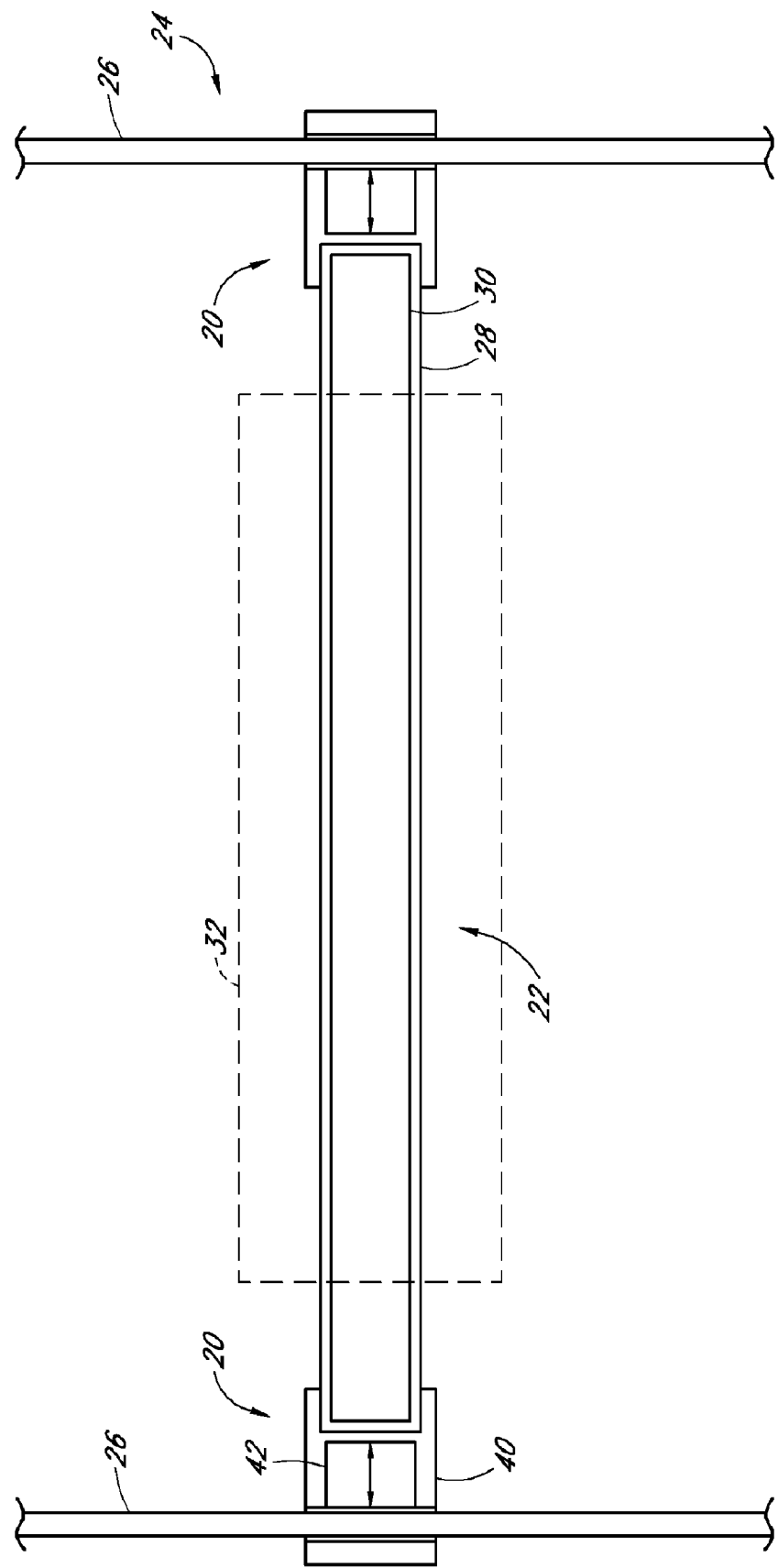
FIG. 1 is a schematic view of a slide assembly attached to a server rack using a pair of rack mount brackets.

FIG. 1 illustrates a pair of rack mount brackets 20 having certain features, aspects and advantages of the present invention securing a slide assembly 22 to a server rack 24. More particularly, the rack mount brackets 20 secure the slide assembly 22 to vertical support rails 26 of the rack 24.

As will be appreciated by those of skill in the art, the slide assembly 22 includes multiple slide segments telescopically engaged with one another. For example, the illustrated slide assembly 22 includes an outer slide segment 28 and an inner slide segment 30 telescopically engaged with the outer slide segment 28. Although two slide segments 28, 30 are shown, the slide assembly 22 may include more or fewer slide segments or components, as desired or required. For example, the slide assembly 22 may include one or more intermediate slide segments (not shown) operatively interposed between the outer slide segment 28 and the inner slide segment 30. Thus, the slide assembly 22 could be a three segment slide, a four segment slide, or could include other numbers of slide segments. The slide assembly 22 is preferably capable of supporting an object, such as a server 32, relative to the rack 24. One of the slide segments, such as the outer slide segment 28, may be secured to the vertical rails 26 of the rack 24 (via a rack mount bracket 20) while the server 32 is carried by the inner slide segment 30. Thus, the inner slide segment 30 can be extended from the outer slide segment 28 to move the server 32 out of the rack 24 and retracted into the outer slide segment 28 to move the server 32 into the rack 24.

In other arrangements, a rack mount bracket according to any embodiment disclosed herein or variations thereof can be used to secure other types of drawers, other movable or stationary compartments, trays, shelves, structural or non-structural members or other members to a rail or frame member. Accordingly, those skilled in the art will recognize that the applicability of the bracket arrangements disclosed herein and/or variations thereof are not limited to slide assemblies.

In the illustrated arrangement, the rack mount bracket 20 generally includes a stationary portion 40 and a movable portion 42. The stationary portion 40 is secured to the slide assembly 22 and more specifically to the outer slide segment 28. The movable portion 42 is movable relative to the stationary portion 40. The stationary portion 40 and the movable portion 42 cooperate to capture the vertical support rail 26 of the rack 24 therebetween. As discussed in greater detail herein, the vertical support rail 26 typically includes a plurality of openings that permit the slide assembly 22 to be mounted at one of a plurality of available, discrete positions along the height of the support rails 26. Preferably, the rack mount brackets 20 are configured to engage one or more of the openings of the support rail 26.

One embodiment of a rack mount bracket 20 is described in greater detail with reference to FIGS. 2-9. As discussed, the rack mount bracket 20 can include a movable portion 42 that is movable relative to an adjacent stationary portion 40. The stationary portion 40 is referred to herein as such as a matter of convenience because it is typically secured to the slide assembly 22 (FIG. 1). However, such a designation or reference is not intended to limit the present invention. In some embodiments, the stationary portion 40 is a generally L-shaped bracket that includes a base 44 and a flange 46. The flange 46 can extend away from the base 44, preferably in a substantially perpendicular direction from the base 44.

With continued reference to FIGS. 2-9, the movable portion 42 can generally include a T-shape so that it comprises a base portion 48 and a head portion 50. The movable portion 42 can be slidably engaged to the stationary portion 40 using a suitable arrangement, such as a slot and pin connection 52. The illustrated rack mount bracket 20 includes two such pin and slot connections 52 with the pins being associated with the stationary portion 40 and slots formed in the movable portion 42. However, the pins and slots may be reversed as desired or required by a particular application or use. In addition, other suitable arrangements to permit relative movement between the movable portion 42 and the stationary portion 40 may be used, such as, for example, a rail system, another coupled system and/or the like. Thus, the movable portion 42 can be selectively moved relative to the stationary portion 40 to vary a distance between the flange 46 of the stationary portion 40 and the head portion 50 of the movable portion 42. Such relative movement permits the rack mount bracket 20 to be assembled to or removed from the vertical support rail 26 of the rack 24 (FIG. 1).

In some embodiments, the head portion 50 of the movable portion 42 and/or the flange 46 of the stationary portion 40 include one or more projecting surface features, each of which are capable of engaging an opening or other feature of the vertical support rail 26 of the rack 24. In the illustrated arrangement, the projecting surface features or projections are included on both the head portion 50 and the flange 46 and cooperate with each other to permit the rack mount bracket 20 to be securely connectable to any of the current five opening standards of the vertical support rails 26 of a server rack 24. In particular, the five specific opening standards include a square hole opening, an M6 tapped (threaded) opening, a 0.25 diameter opening, a 0.281 diameter opening and a No. 10 tapped (threaded) opening. However, the rack mount bracket 20 can be configured for use with only some of these standards and/or other existing standards. In addition, the rack mount bracket 20 may be adapted for use with non-standard (e.g., unique, customized, etc.) patterns or standards that have not yet been developed, either in addition to or in lieu of the five current standards discussed herein. For example, in some embodiments, the diameters and other dimensions (e.g., 0.25, 0.281, etc.) provided herein are in inches. In alternative arrangements, however, a rack mount bracket 20 can be adapted to engage rails 26 having openings that are sized for the metric (e.g., cm, mm, etc.) or a different measuring convention. Accordingly, one of ordinary skill in the art will appreciate that a rack mount bracket need not be limited to the specific embodiments disclosed herein.

In the illustrated arrangement, the rack mount bracket 20 includes a first set of engagement assemblies 60 which are configured to engage one or more openings of the vertical rail 26. In particular, the depicted bracket 20 comprises three sets of the first engagement assemblies 60, each of which includes a hollow cylinder 62 that cooperates with a pin 64. The pin 64 can be configured to be received within a hollow recess 66 of the hollow cylinder 62. Each of the first engagement assemblies 60 is preferably substantially similar in construction.

With continued reference to FIGS. 2-9, the illustrated rack mount bracket 20 can also include a second set of engagement assemblies 70 that are configured to engage with openings of the vertical support rail 26. In the depicted arrangement, two such second engagement assemblies 70 are provided within the spaces defined between the first engagement assemblies 60. As shown, the second engagement assemblies 70 include a projection 72 formed on the head portion 50 of the movable portion 42. The projection 72 includes a square projecting portion 74 and a cylindrical projecting portion 76 which extends from an outward surface (e.g., toward the flange 46) of the square projecting portion 74. The second engagement assembly 70 can also include an opening 78 formed in the flange 46 of the stationary portion 40. The opening 78 can be configured to receive the cylindrical projecting portion 76 of the projection 72. As discussed herein, in some arrangements, the first engagement assembly 60 and the second engagement assembly 70 cooperate to permit the rack mount bracket 20 to be used with a plurality of opening types of the vertical support rail 26, and preferably, with at least the five current standards described herein.

The movable portion 42 of the rack mount bracket 20 includes two portions that are movable relative to one another. Specifically, the head portion 50 includes a front member 80 and a rear member 82. These members 80, 82 are described as forward and rearward with respect to their position relative to the flange 46 of the stationary portion 40 as a matter of convenience. Thus, these designations are not intended to limit the present inventions to any particular disclosed arrangement. In some embodiments, the projections 72 are connected to the front member 80 and are preferably formed integrally therewith. Further, the hollow cylinders 62 are connected to the rear member 82 and are preferably integrally formed therewith. The main body or first portion 48 of the movable portion 42 can include a first section 84 that is connected to and preferably integrally formed with the forward member 80. The first portion 48 can also include a second section 86 that is connected to and preferably integrally formed with the rearward member 82.

Figure 2:
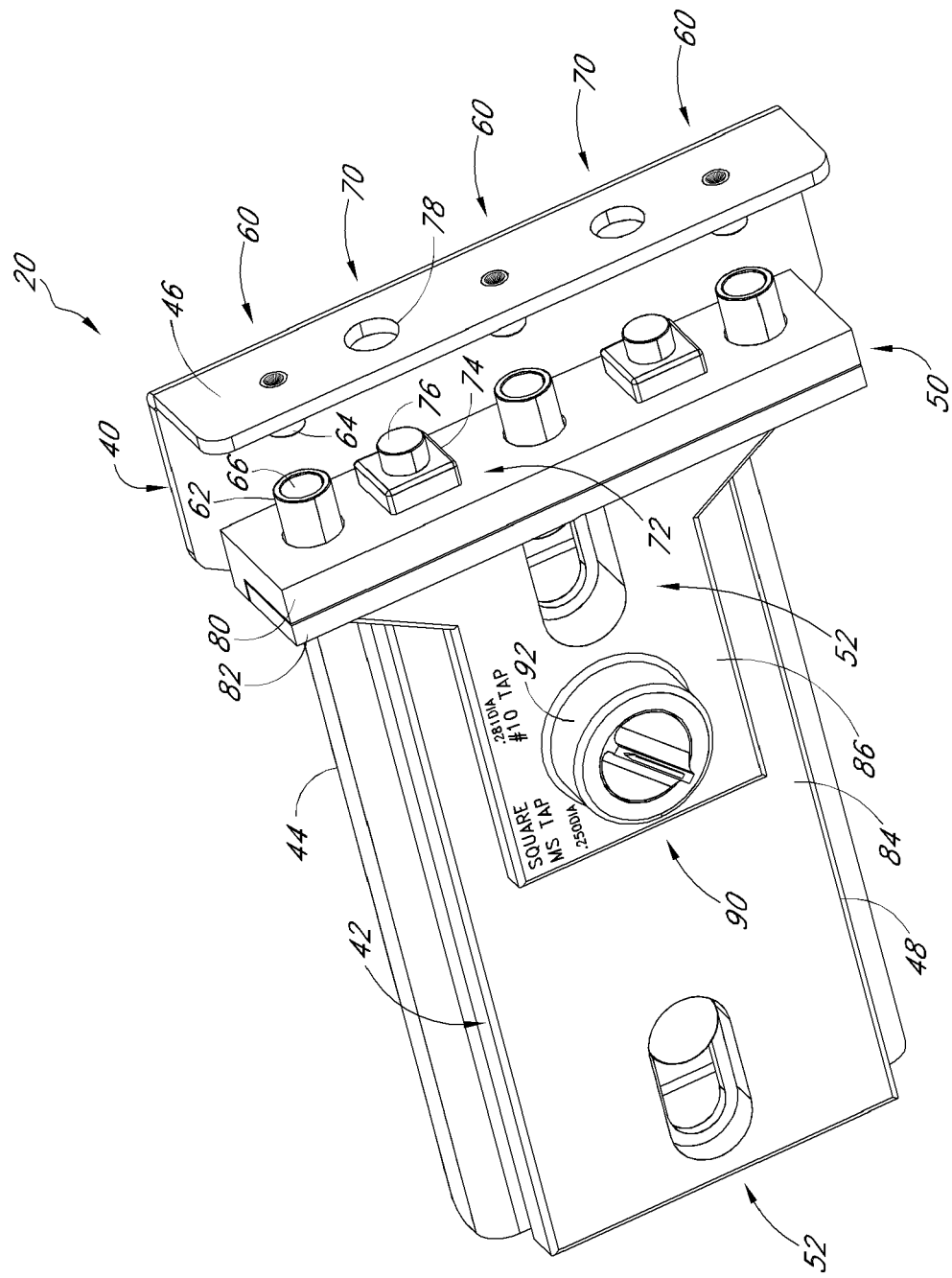
FIG. 2 is a perspective view of one embodiment of a rack mount bracket in a first orientation.
Figure 3:
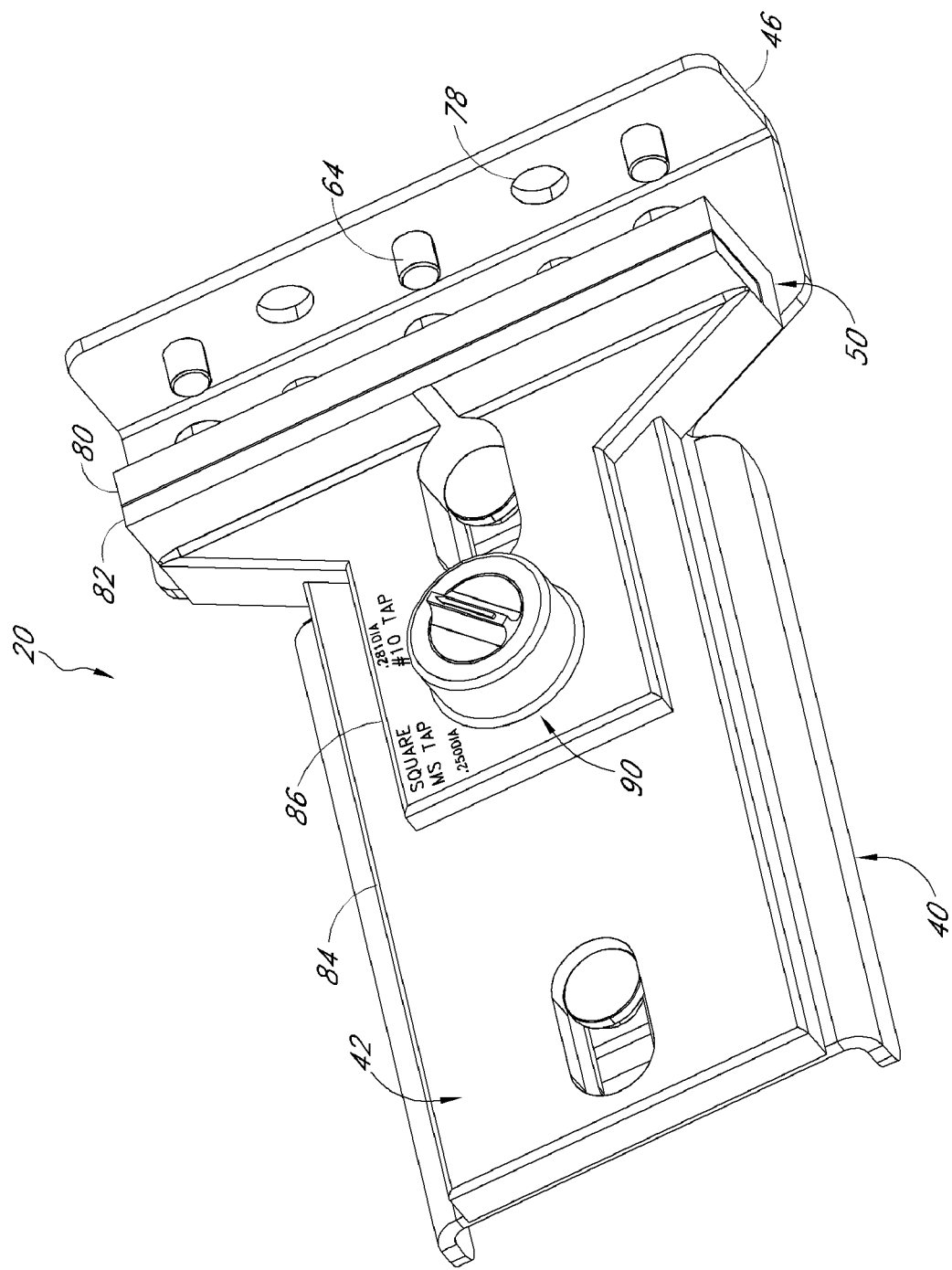
FIG. 3 is another perspective view of the rack mount bracket of FIG. 2 in the first orientation.
Figure 4:
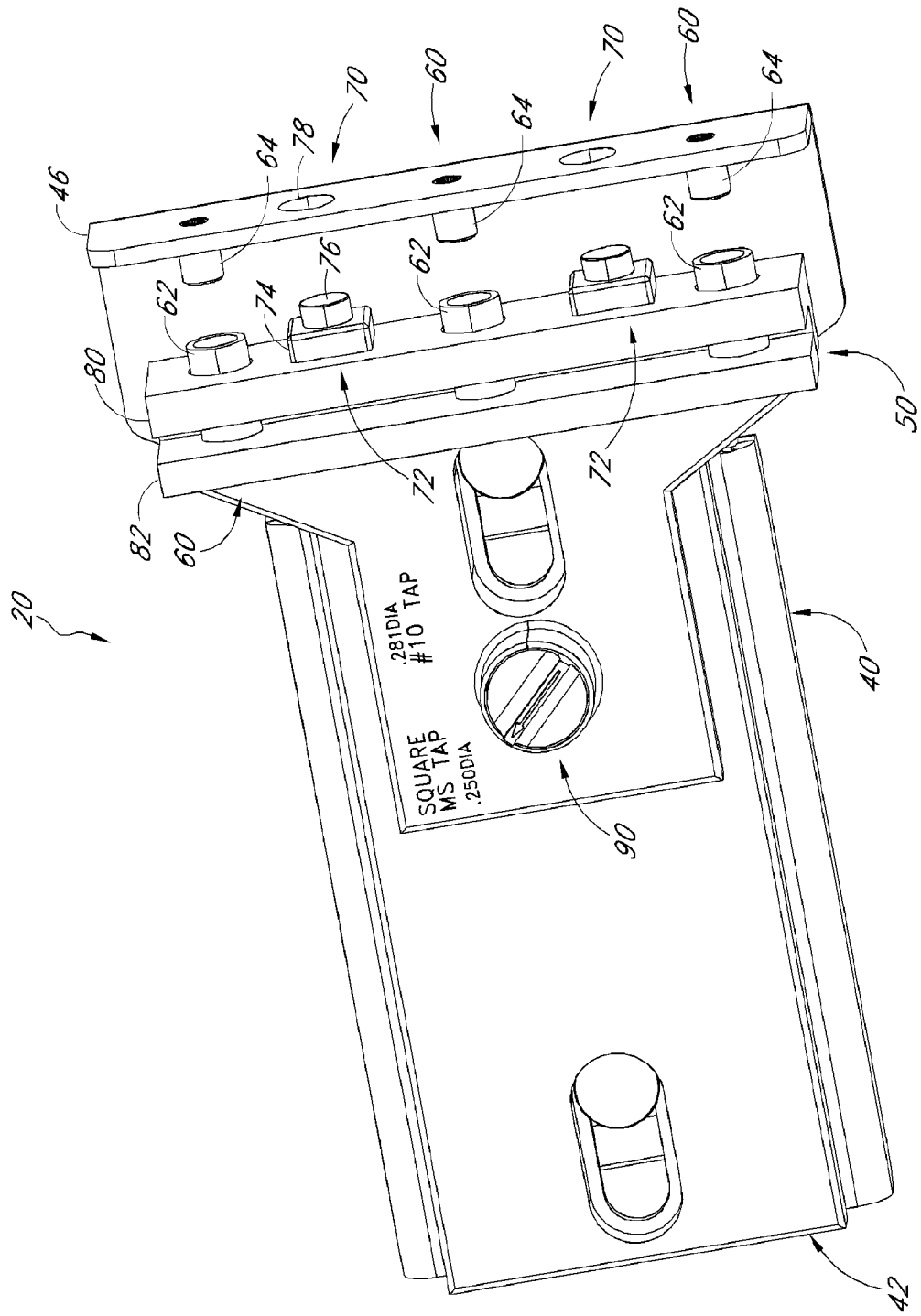
FIG. 4 is a perspective view of the rack mount bracket of FIGS. 2 and 3 in a second orientation.
Figure 5:
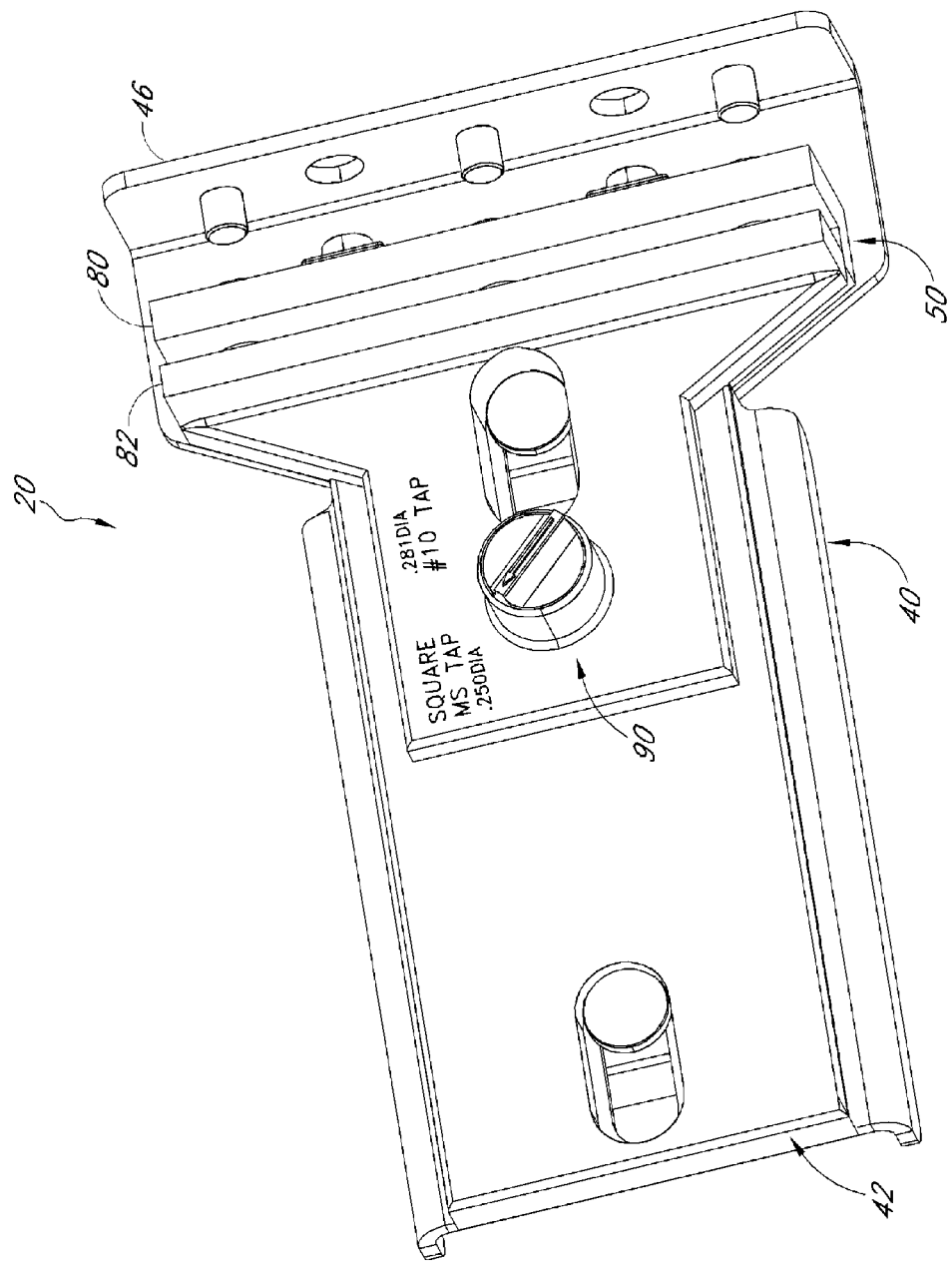
FIG. 5 is another perspective view of the rack mount bracket of FIGS. 2 and 3 in the second orientation.

In some embodiments, the front member 80 may be advanced relative to the rear member 82 toward the flange 46 to alter a relative orientation of the hollow cylinders 62 and the projections 72 from the orientation of FIGS. 2 and 3, as illustrated in FIGS. 4 and 5. With the rear member 82 advanced toward the front member 80, the outward end surfaces of the hollow cylinder 62 are preferably substantially aligned with the outward end surfaces of the cylindrical portion 76 of the projections 72. However, when the rear member 82 is retracted from the front member 80, the projections 72 are advanced such that the cylindrical portion 76 of the projections 72 are closer to the flange 46 than the hollow cylinder 62. Preferably, outward ends of the hollow cylinders 62 are substantially aligned with outward end surfaces of the square portions 74 of the projections 72. In some embodiments, a selector mechanism 90 permits the first and second sections 84, 86 (and the front member 80 and rear member 82) to be moved relative to one another between the first and second orientations of FIGS. 2-3 and FIGS. 4-5, respectively. The selector mechanism 90 can include a knob 92 having a pin and cam arrangement, as illustrated in FIGS. 6 and 7, such that rotation of the knob 92 causes relative movement between the first section 84 and the second section 86. However, other suitable arrangements to vary the relative position of the first section 84 and the second section 86 may also be used.

With reference to FIGS. 6 and 7, the movable portion 42 of the rack mount bracket 20 can be biased toward the flange 46 of the stationary portion 40 by a biasing arrangement 100. The illustrated biasing arrangement includes a spring, such as a coil spring. However, other suitable arrangements may also be used. Preferably, the rack mount bracket 20 also includes a latch 110 which can be used to secure the movable portion 42 and stationary portion 40 in a desired position relative to one another. Preferably, the latch 110 can be used to secure the movable portion 42 and the stationary portion 40 in a closed position relative to one another so that the rack mount bracket 20 can be secured to a vertical rail 26. In such arrangements, the latch 110 can selectively inhibit the undesired removal or disengagement of the rack mount bracket 20 from the rail 26 of the rack 24. In addition, the latch 110 can also provide suitable finger grip surfaces to permit the movable portion 42 and stationary portion 40 to be moved to an open position relative to one another. This can advantageously permit the rack mount bracket 20 to be assembled to a vertical rail 26 by overcoming the biasing arrangement 100. Further, such an arrangement can permit the rack mount bracket 20 to be assembled and secured to a vertical rail 26 without the use of tools. However, in other arrangements, the use of fasteners or fastening mechanisms, either removable or permanent, to fasten the rack mount bracket 20 in a closed position may be desired or required. Thus, one or both of the biasing arrangement 100 and latch 110 can be omitted.

In the embodiment illustrated in FIGS. 2-5, the rack mount bracket 20 comprises three sets of first engagement assemblies 60 and two sets of second engagement assemblies 70. However, in other arrangements, the number of first engagement assemblies 60 and/or the number of second engagement assemblies 70 can vary. For example, the bracket 20A depicted in FIG. 15 includes a total of four sets of first engagement assemblies 60A and two sets of second engagement assemblies 70A. In other embodiments, a bracket can include more or fewer set of engagement assemblies. In addition, the shape, size, location, spacing, orientation and/or other details of the engagement assemblies can vary as desired or required.

FIGS. 8 and 9 illustrate two cross-sectional views of the rack mount bracket 20 in an open position with a rail 26 inserted between the movable portion 42 and the stationary portion 40. The illustrated rack 26 includes a square hole opening 120 and is thus a square hole standard rail 26.

Figure 10:
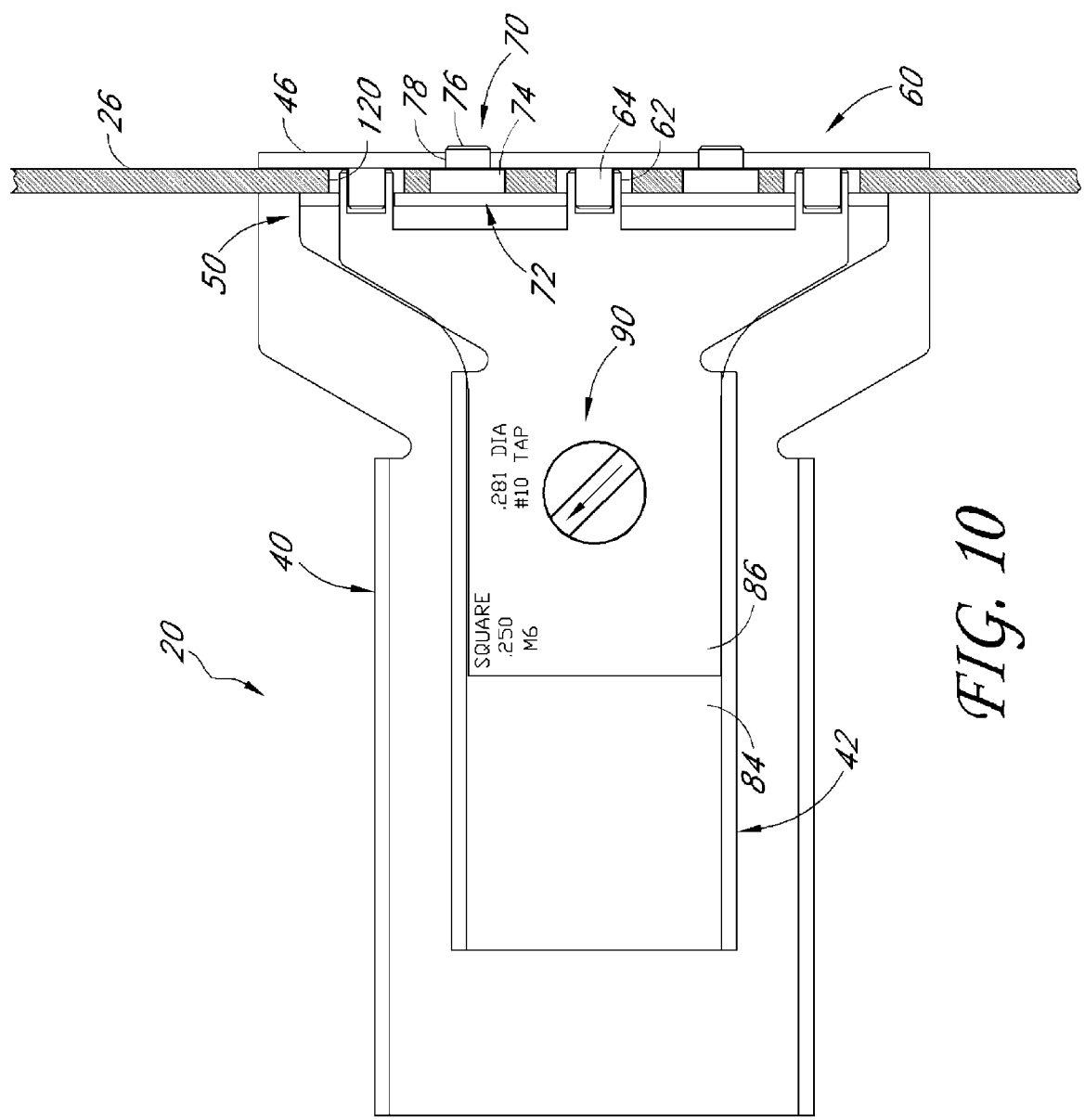
FIG. 10 illustrates the rack mount bracket of FIGS. 1-9 installed in a rack mount having a square hole standard.

FIGS. 10-13 illustrate one embodiment of the rack mount bracket 20 in engagement with each of five rack mount standards. FIG. 10 illustrates the rack mount bracket 20 connected to a square hole rail 26. As shown, when engaged with a square hole standard, the second section 86 of the movable portion 42 is retracted relative to the first section 84, as illustrated in FIGS. 4 and 5. Accordingly, the square portions 74 of the projections 72 engage the square openings 120 of the rack rail 26. Moreover, the cylindrical portion 76 of each projection 72 engages the opening 78 of the flange 46. In addition, each hollow cylinder projection 62 passes through the adjacent square hole 120, without engaging the sides of the square hole 120. Further, the pins 64 are received within the cavity 66 of the hollow cylinder 62. Consequently, a secure connection is made to the rail 26 with the square hole standard.

Figure 11:
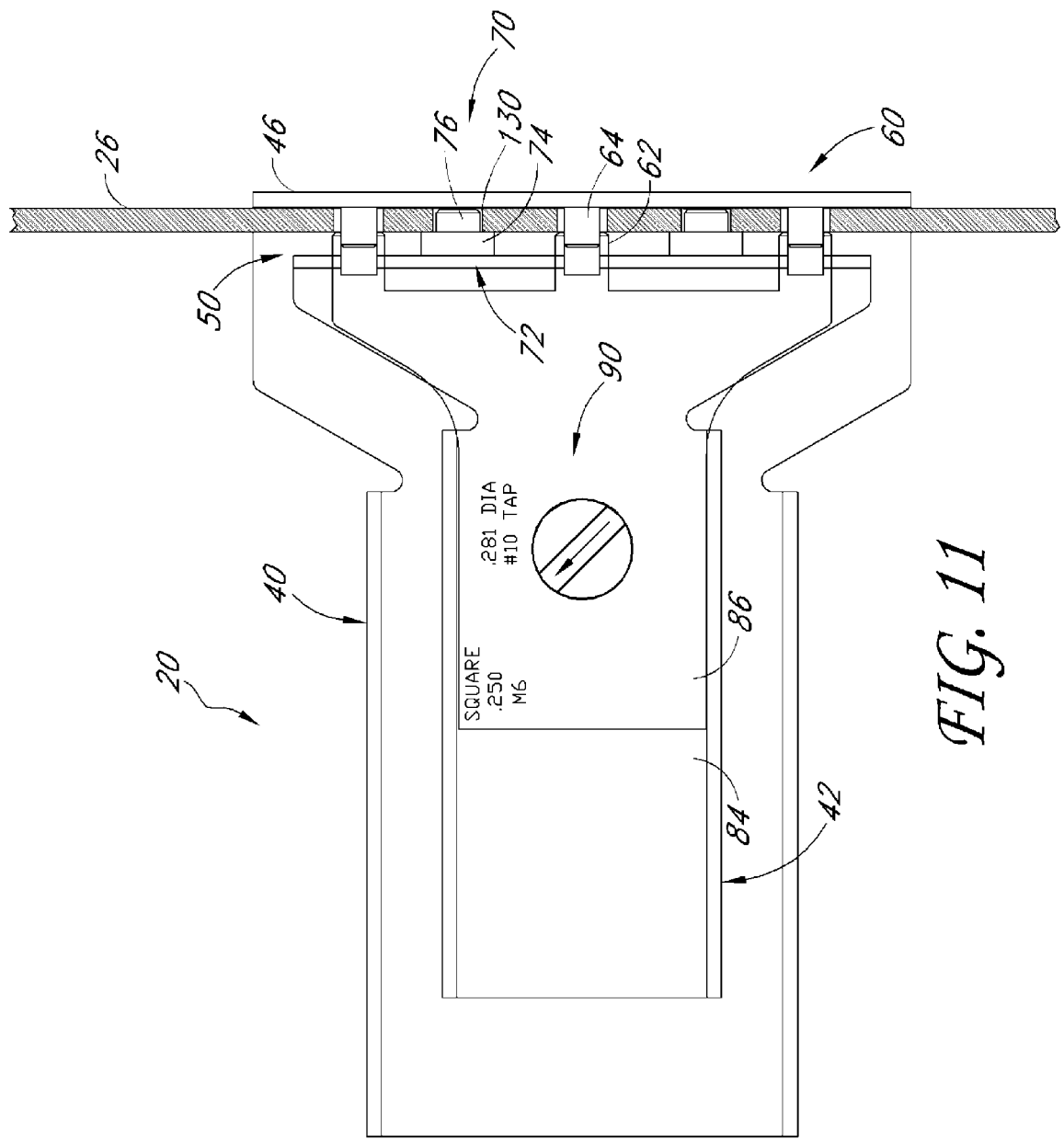
FIG. 11 illustrates the rack mount bracket of FIGS. 1-9 installed in a rack having either a 0.25 diameter hole standard or an M6 tapped hole standard.

With reference to FIG. 11, the rack mount bracket 20 is shown secured to a rail 26 having a 0.25 diameter hole standard or M6 tapped hole standard 130. In this arrangement, the first and second sections 84, 86 of the movable portion 42 are in the orientation shown in FIGS. 4 and 5 and described above with reference to the square hole standard of FIG. 10. In FIG. 11, the cylindrical portion 76 of each projection 72 engages a corresponding opening 130 of the rail 26. As a result, the rail 26 can be captured between the outward surface of the square portion 74 of the projection 72 and the surface of the flange 46 facing the projection 72. In some embodiments, the cylindrical portion 76 of the projection 72 is sized such that it will fit within either the 0.25 diameter hole standard or the M6 tapped hole standard. This can be accomplished because the two standards are sufficiently close to one another in dimension to permit a desirably secure connection to be achieved with a single cylindrical projecting portion 76. Furthermore, the pins 64 can engage the cavity 66 of the hollow cylindrical projection 62 to provide further stability of the movable portion 42 relative to the stationary portion 40.

Figure 12:
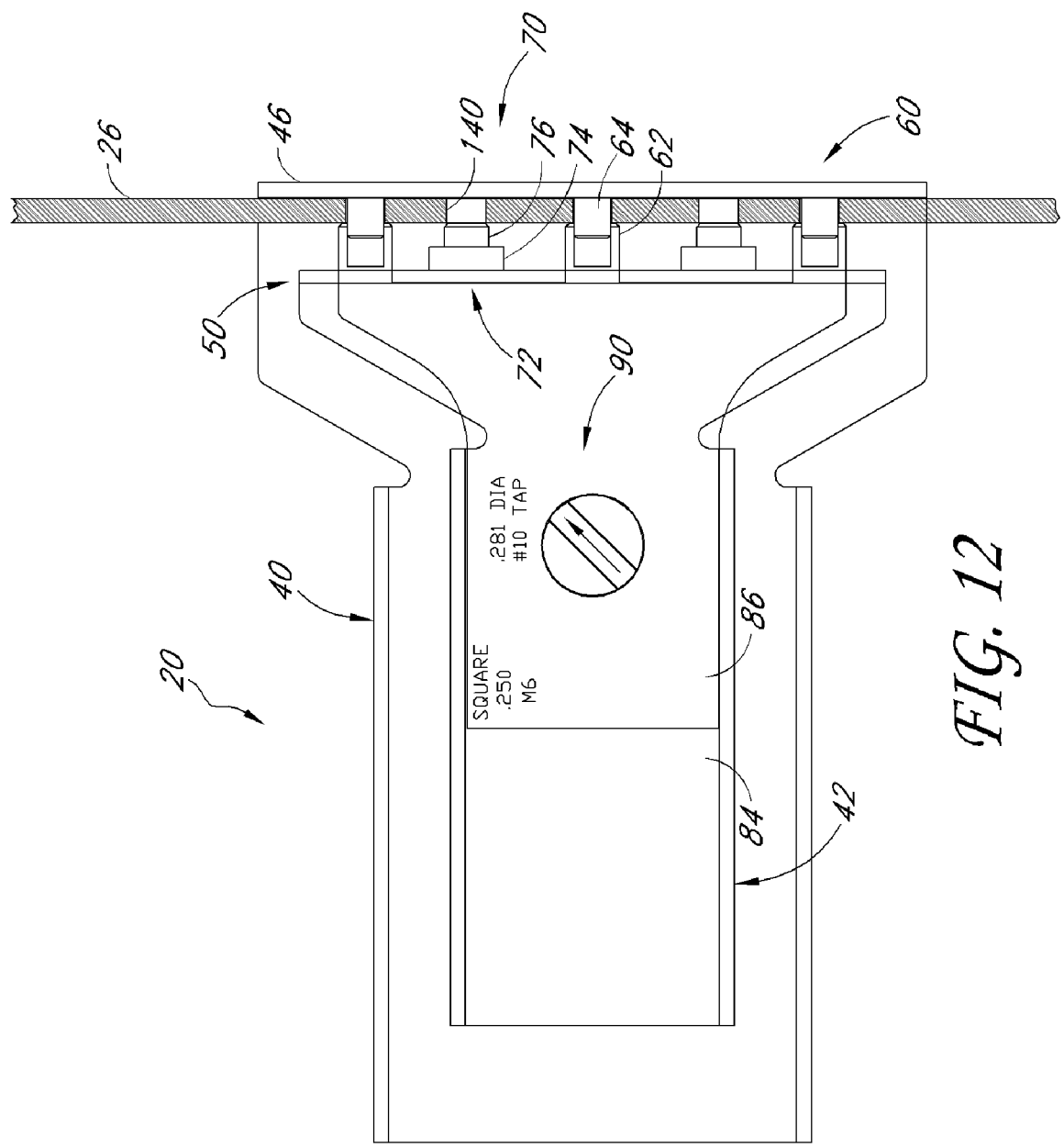
FIG. 12 illustrates the rack mount bracket of FIGS. 1-9 installed in a rack having a No. 10 tapped hole standard.

With reference to FIG. 12, the rack mount bracket 20 is shown engaged to a rail 26 having a No. 10 tapped hole standard. In this arrangement, the bracket 20 is in the orientation shown in FIGS. 2 and 3, wherein the second section 86 of the movable portion 42 is advanced relative to the first section 84. In such an arrangement, the outer surfaces of the hollow cylinders 62 are aligned with the outer surfaces of the cylindrical portions 76 of the projections 72. As illustrated in FIG. 12, the pins 64 can pass through the openings 140 of the rail 26 and the end portions of the pins 64 engage the cavity 66 of the hollow cylinders 62. In addition, the outer surfaces of the cylinder 62 can generally abut the rail 26. Moreover, the outer surfaces of the cylindrical portion 76 of the projection 72 also preferably abut against a surface of the rail 26, because the cylindrical portions 76 may be too large to pass through the openings 140.

Figure 13:
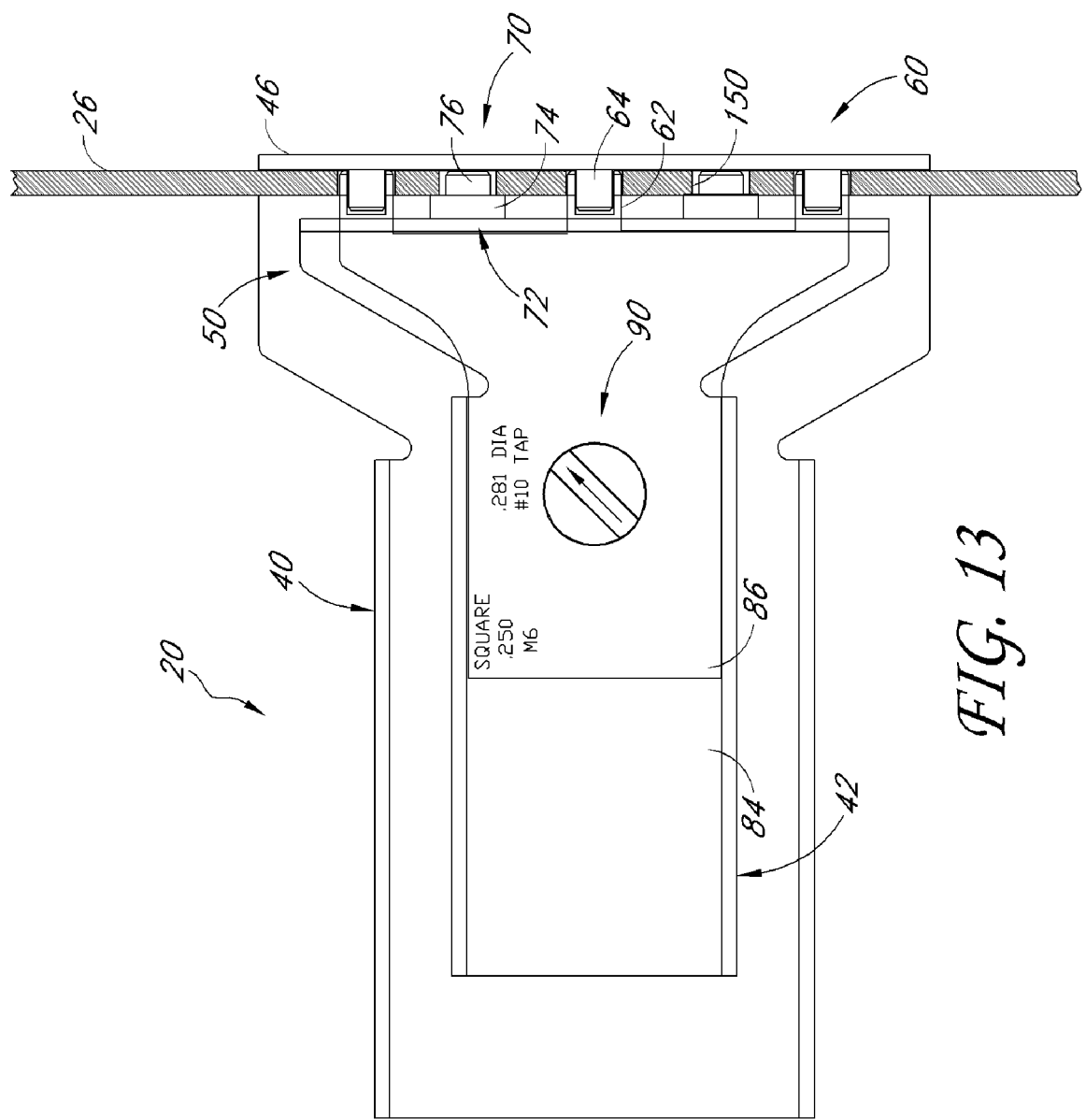
FIG. 13 illustrates the rack mount bracket of FIGS. 1-9 installed in a rack having a 0.281 diameter hole standard.

In FIG. 13, the rack mount bracket 20 is illustrated as being engaged to a rail 26 having openings 150 in accordance with a 0.281 diameter hole standard or the like. In the depicted embodiment, the movable portion 42 is in the orientation of FIGS. 2 and 3 and described herein with reference to FIG. 12 and the No. 10 tapped hole standard. As shown, the hollow cylinders 62 pass through the openings 150 and receive the pins 64 therein. Furthermore, the cylindrical portion 76 of the projection 72 pass into the openings 150 and outward surfaces of the square portions 74 of the projections 72 abut against a surface of the rail 26 adjacent the openings 150. Thus, the rail 26 can be advantageously captured between the outer surfaces of the square portion 74 of the projection 72 and the surface of the flange 46 facing the projections 72.

Figure 14:
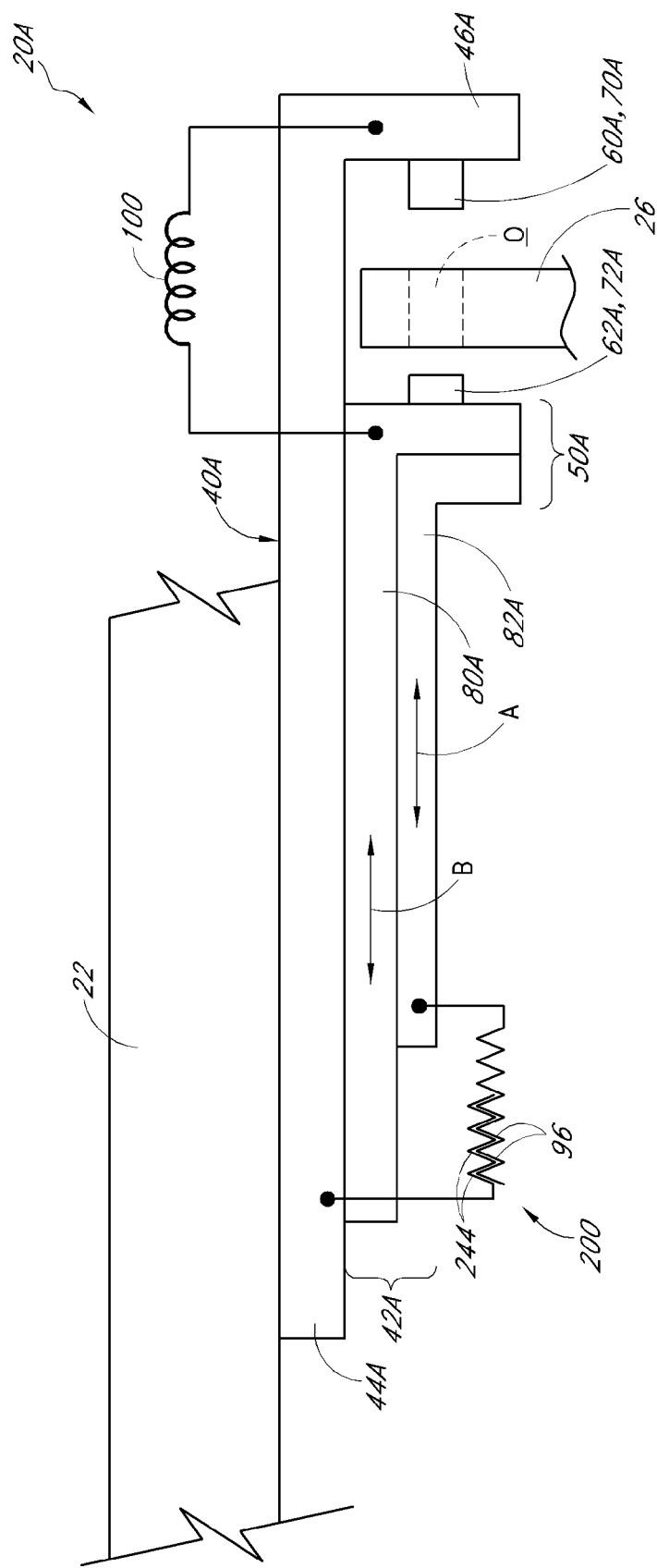
FIG. 14 schematically illustrates a rack mount bracket comprising an engagement mechanism according to one embodiment.

FIG. 14 schematically illustrates one embodiment of a rack mount bracket 20A configured to engage a rail 26 having one or more types of openings O. As shown, the rack mount bracket 20A can be connected to a slide assembly 22. In the illustrated arrangement, the slide assembly 22 (e.g., the outer slide member) is attached to the stationary portion 40A of the bracket 20A. As with other arrangements disclosed herein, the stationary portion 40A can generally comprise an L-shaped bracket having a base 44A and a flange 46A.

With continued reference to FIG. 14, the rack mount bracket 20A also includes a movable portion 42A that is slidably engaged with the stationary portion 40A by a suitable arrangement, such as, for example, a slot and pin connection and/or the like. Thus, as with other embodiments disclosed herein, the movable portion 42A can be selectively moved relative to the stationary portion 40A (e.g., in the direction generally represented by arrow B) to vary a distance between the flange 46A of the stationary portion 40A and a head portion 50A of the movable portion 42A.

As discussed herein in reference to FIGS. 1-9, the head portion 50A of the movable portion 42A and/or the flange 46A of the stationary portion 40A can include one or more projecting features, each of which are configured to engage an opening O of the vertical support rail 26 of the rack. In some embodiments, the movable portion 42A is biased toward the flange 46A of the stationary portion 40A by a biasing arrangement 100, such as, for example, a coil spring, another type of spring or biasing member and/or the like. However, other suitable arrangements may also be used, either in lieu or in addition to springs.

As illustrated in FIG. 14, the movable portion 42A can include two sections or members that are movable relative to each another. For example, in some embodiments, the head portion 50A comprises a front member 80A that can be selectively moved (e.g., in a direction generally represented by arrow A) relative to a rear member 82A. As discussed herein with reference to other arrangements, the relative movement of the front member 80A and the rear member 82A permits a user to select the type of projections and/or recesses 60A, 62A, 70A, 72A that will be used to engage one or more openings O of the vertical support rail 26.

Further, the rack mount bracket 20A can advantageously comprise an engagement mechanism 200, such as a latch, that is configured to normally maintain the movable portion 42A in a desired position, such as a closed or substantially closed position, relative to the stationary portion 40A. For example, unless certain affirmative steps or actions are performed (e.g., causing the engagement mechanism 200 to move to a release position), the engagement mechanism 200 can be configured to inhibit or prevent opening of the bracket 20A. That is, the engagement mechanism 200 can inhibit or prevent relative movement between the head portion 50A and the flange 46A in a direction that increases a distance between the head portion 50A and the flange 46A. Accordingly, this can help ensure that the bracket 20A remains securely attached to the rail 26.

In some embodiments, as schematically illustrated in FIG. 14, the engagement mechanism 200 comprises two sets of teeth 96, 244 or other members that are shaped, sized and otherwise configured to generally mate, interlock or interfere with one another. As discussed, this can restrict the movement of the movable portion 42A generally away from the flange 46A of the stationary portion 40A. In some arrangements, the engagement mechanism 200, when engaged, permits movement of the movable portion 42A relative to the stationary portion 40A in only one direction (e.g., to permit a biasing force of the spring 100 to decrease the spacing between the head portion 50A of the movable portion 42A and the flange 46A of the stationary portion 40A).

As discussed herein with reference to FIGS. 15-18B, the engagement mechanism 200 can include one or more release members or features (e.g., depressible members 202) that cause the teeth 96, 244 or other generally interlocking members, surfaces or features of the engagement mechanism 200 to disengage from each other. Thus, by manipulating such a release member, the movable portion 42A can be moved in a direction generally away from the flange 46A of the stationary portion 40A. This can advantageously provide sufficient spacing between the flange 46A and the head portion 50A to permit a rail member to be positioned therebetween. Thus, one or more projections and/or recesses 60A, 62A, 70A, 72A of the bracket 20A can subsequently engage one or more openings O in the vertical support rail 26. The biasing member 100 can move the flange 46A and head portion 50A, or assist in moving the flange 46A and head portion 50A, towards a closed position (e.g., a position in which the bracket 20A is secured to the support rail. In addition, the spring or other biasing member 100 and the engagement mechanism 200 can help maintain a desired engagement orientation between corresponding projections and/or recesses 60A, 62A, 70A, 72A of the head portion 50A and the flange 46A. In turn, this can help secure the bracket 20A to the support rail.

Figure 15:
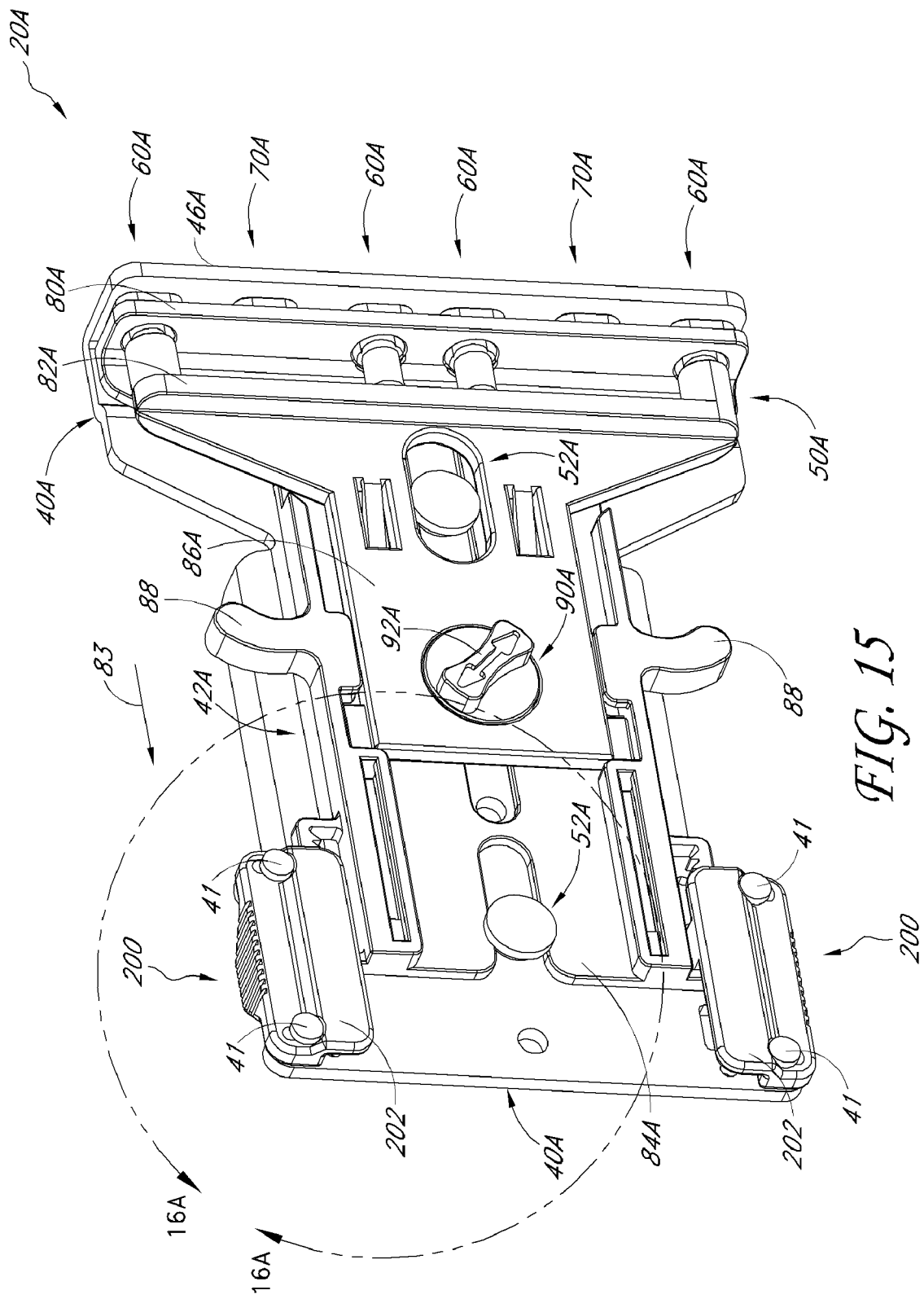
FIG. 15 illustrates a perspective view of a rack mount bracket according to one embodiment.

FIG. 15 illustrates a perspective view of one embodiment of a rack mount bracket 20A comprising one or more engagement mechanisms 200 and handle members 88 to facilitate securing the bracket 20A to a support rail. As with other embodiments disclosed herein, the depicted bracket 20A comprises a stationary portion 40A with a flange 46A. In addition, the rack mount bracket 20A includes a movable portion 42A that is slidably engaged with the stationary portion 40A using a slot and pin connection 52A or any other suitable arrangement and/or method. The illustrated rack mount bracket 20A includes two such pin and slot connections 52A. Alternatively, one or more other types of arrangements that permit relative movement between the movable portion 42A and the stationary portion 40A can be used, either in lieu of or in addition to a slot and pin connection 52A. Thus, the movable portion 42A can be configured to move relative to the stationary portion 40A so as to vary a distance between the flange 46A of the stationary portion 40A and a head portion 50A of the movable portion 42A. Such relative movement permits the rack mount bracket 20A to be assembled to or removed from a vertical support rail. In some embodiments, such assembly and/or removal can be conveniently accomplished without the use of tools.

With continued reference to FIG. 15, the movable portion 42A can include two members or sections that are movable relative to one another. For example, a head portion 50A includes a front member 80A and a rear member 82A. The front member 80A can be part of or connected to a first section 84A of the movable portion 42A. Likewise, the rear member 82A can be part of or connected to a second section 86A of the movable portion 42A. In some arrangements, the second section 86A can be slidably moved relative to the first section 84A (e.g., between one, two or more distinct positions, as disclosed with reference to alternative embodiments) using a selector mechanism 90A. As discussed herein, the selector mechanism 90A can include a knob 92A having a pin and cam arrangement. However, the selector mechanism 90A can comprise a different configuration (e.g., lever, switch, etc.), as desired or required by a particular application or use.

As discussed with reference to the embodiments of FIGS. 2-13, the rack mount bracket 20A illustrated in FIG. 15 can include a first and second set of engagement assemblies that are configured to engage one or more openings of a vertical rail. The engagement assemblies can include hollow cylinders or recesses that mate or otherwise cooperate with corresponding pins or protruding members. In some embodiments, the first engagement assembly and the second engagement assembly cooperate to permit the rack mount bracket 20A to be used with a plurality of opening types of the vertical support rail and, preferably, with at least the five current standards as described herein.

In the embodiment illustrated in FIG. 15, the rack mount bracket 20A includes two engagement mechanisms 200 located at opposite vertical ends, near the rear edge of the stationary portion 40A. However, the quantity, location, size, shape and/or other details of the engagement mechanisms 200 used in a particular bracket can vary. As discussed herein with reference to the schematic of FIG. 14, the engagement mechanisms 200 can be used to prevent or restrict relative movement between the movable portion 42A and the stationary portion 40A, in one or more directions of movement between the portions 40A and 42A. This can help ensure that the bracket 20A remains securely attached to the rail. For example, the engagement mechanism 200 can prevent the movable portion 42A from being moved rearwardly (e.g., in a direction generally represented by arrow 83). As a result, the flange 46A and the head portion 50A can be maintained in a desired relative position to ensure that the bracket 20A remains secured to a rail or other frame member.

Figure 16A:
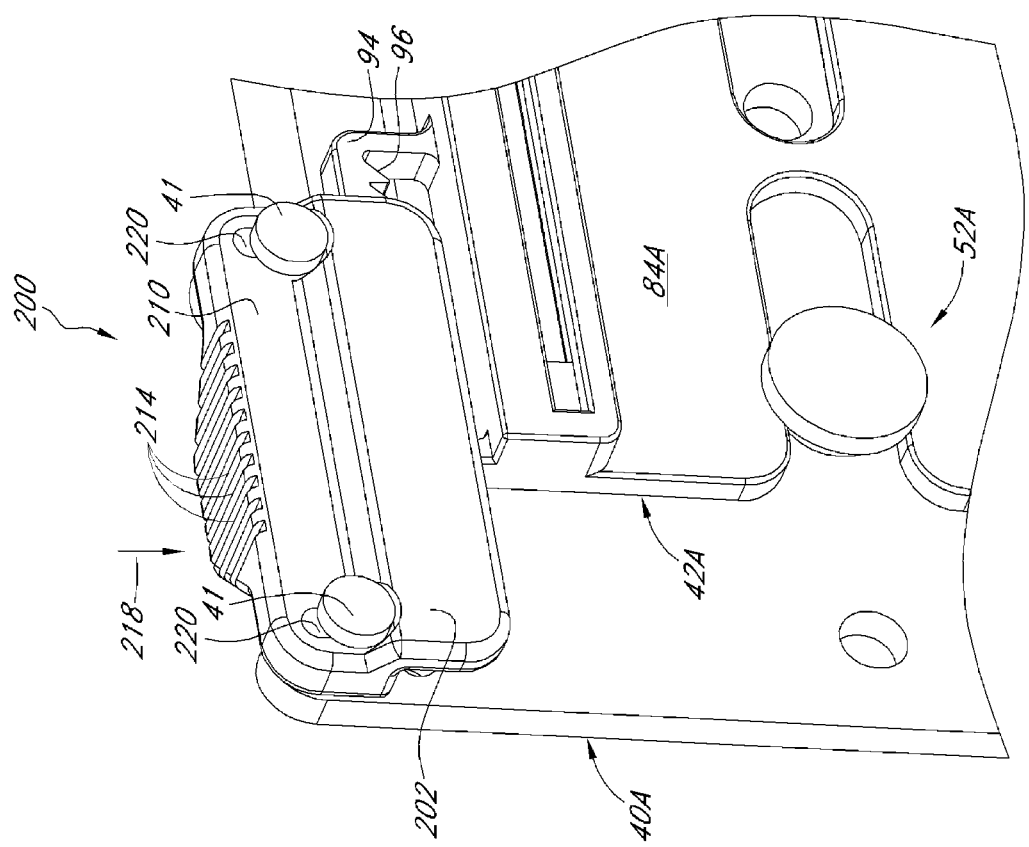
FIG. 16A illustrates a detailed view of an engagement mechanism for the rack mount bracket of FIG. 15.

FIG. 16A illustrates a detailed perspective view of the upper engagement mechanism 200 of rack mount bracket 20A of FIG. 15. As shown, the engagement mechanism 200 includes a depressible member 202 that is mechanically connected to the stationary portion 40A using two fasteners 41 (e.g., rivets, bolts, screws, other projections, etc.). In the depicted embodiment, the fasteners 41 pass through corresponding slotted openings 220 of the depressible member 202. This can allow the position of the depressible member 202 to be varied within a particular range relative to the stationary portion 40A.

Figure 16B:
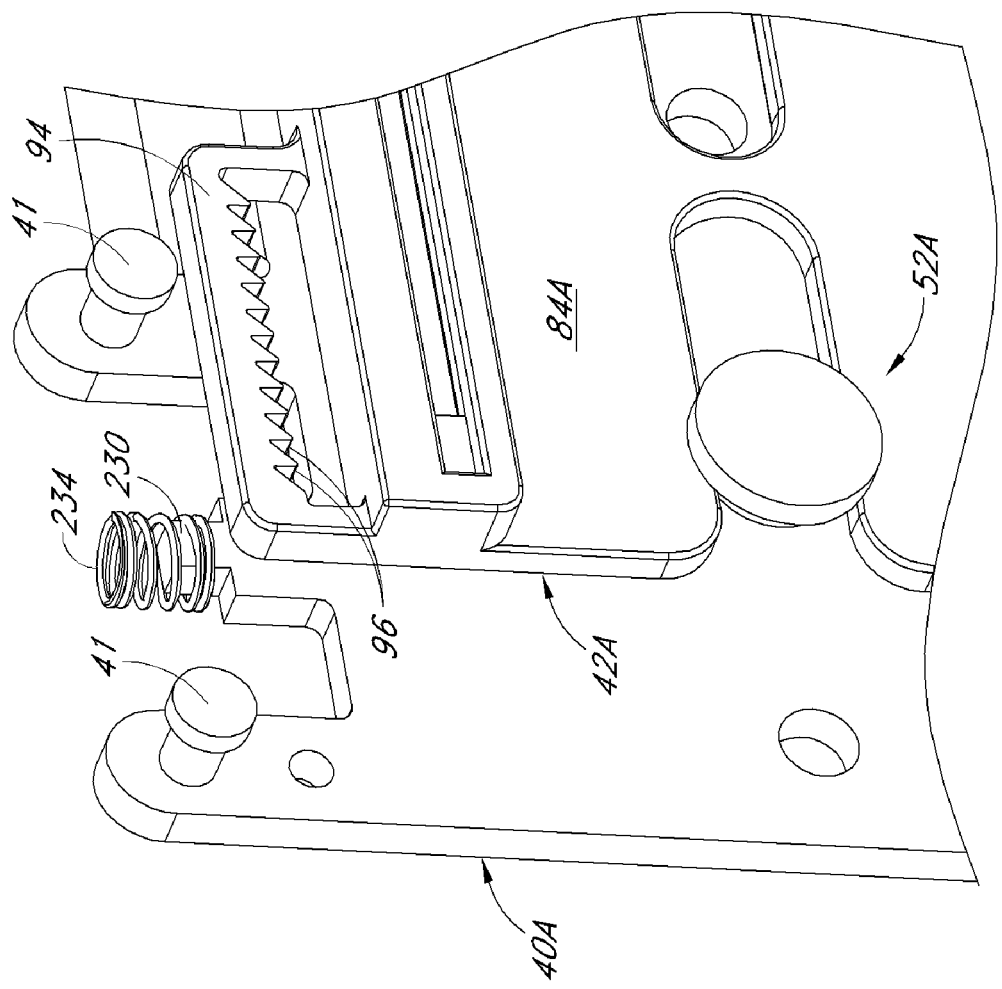
FIG. 16B illustrates a detailed view of the rack mount bracket of FIG. 15 with the depressible member of the engagement mechanism removed for clarity.

In FIG. 16B, the depressible member 202 has been removed to reveal other components and features of the engagement mechanism 200. The illustrated arrangement includes a post 230 on which is positioned a spring 234 or other biasing member. Accordingly, when the depressible member 202 is secured to the stationary portion 40A using fasteners 41 or the like, the depressible member 202 can be configured to be resiliently biased generally away from the post 230 (e.g., upwardly as depicted in FIG. 16B). When a user applies a force on the depressible member 202 (e.g., in the direction generally represented by arrow 218 in FIG. 16A), the depressible member 202 can be urged against the spring 234 or other biasing member (e.g., downwardly as illustrated in FIG. 16A). The depressible member 202 can include a plurality of ridges 214, grooves and/or any other features along a portion of its surface on which a user is directed to apply a force.

With continued reference to FIG. 16B, the movable portion 42A can include a row 94 of teeth 96 or other engagement members. In the illustrated arrangement, such teeth 96 are generally slanted in one direction. As shown, the teeth 96 can form a unitary structure with the movable portion 42A. Alternatively, the teeth 96 can be included on a separate component or member that is permanently or removably attached to the movable portion 42A. In addition, the shape, size, quantity, spacing, location (e.g., relative to the movable portion 42A) and/or other details regarding the teeth 96 or other engagement members can vary, as desired or required by a particular application or use.

Figure 17:
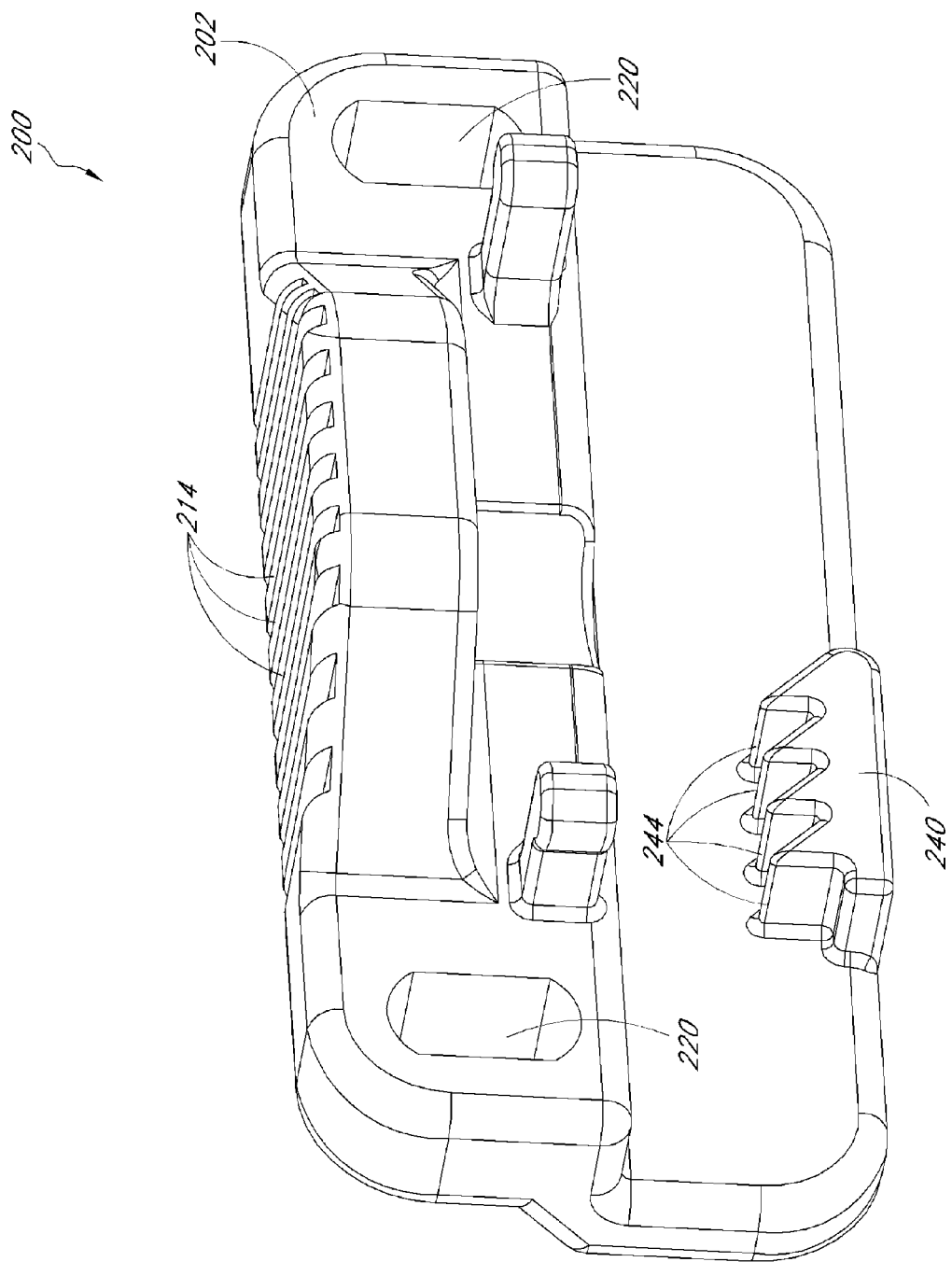
FIG. 17 illustrates an opposite perspective view of the depressible member of the engagement mechanism of FIGS. 15, 16A and 16B.

The teeth 96 or other engagement members or features of the movable portion 42A can be configured to engage, mesh or otherwise mate with corresponding teeth or other engagement members or features associated with the stationary portion 40A. In some embodiments, as illustrated in FIG. 17, the depressible member 202 comprises one or more teeth 244 that are shaped, sized and otherwise configured to mesh with the teeth 96 of the movable portion 42A. For example, the teeth 244 situated on the depressible member 202 can be slanted in such a direction so as to generally match the slant of the teeth 96 of the movable portion 42A.

Accordingly, the teeth 96 of the movable portion 42A can be configured to lockingly engage the teeth 244 of the depressible member 202 when the movable portion 42A is urged away from the flange 46A of the stationary portion 40A (e.g., in a direction generally represented by arrow 83). Therefore, the movable portion 42A can be prevented from moving away from the flange 46A. As discussed, the movable portion 42A and the depressible member 202 can be configured to permit relative movement between the opposing sets of teeth 96, 244 only in one direction. For example, the teeth 96, 244 can comprise corresponding slanted surfaces that are configured to slide relative to one another when moved in a particular direction.

Figure 18B:
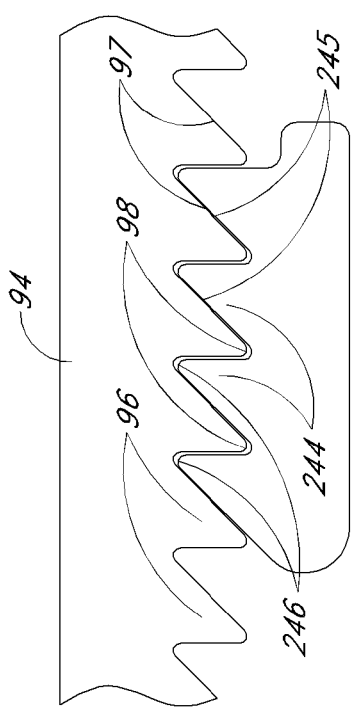
FIGS. 18B and 18C illustrate detailed elevation views of the interaction of adjacent teeth of the engagement mechanism of FIG. 15.
Figure 18C:
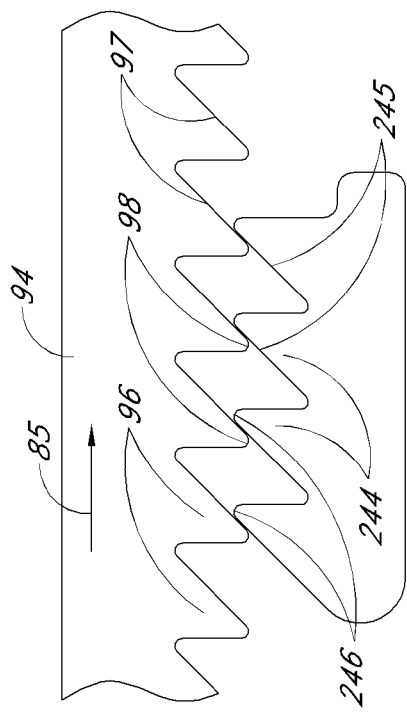
Figure 18A:
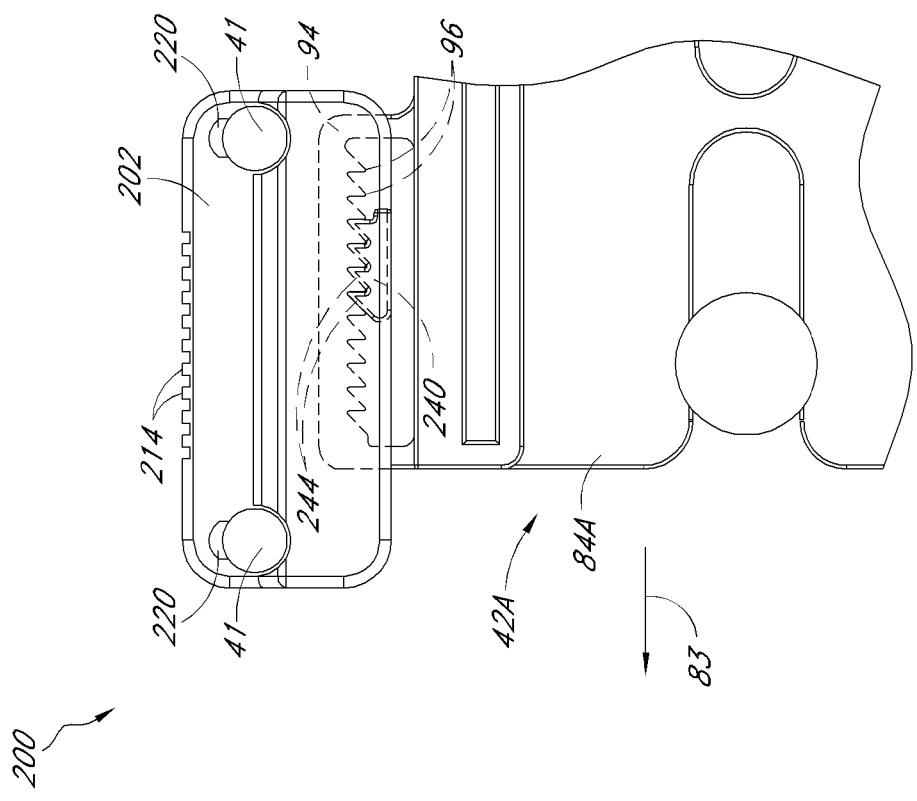
FIG. 18A illustrates an elevation view of the engagement mechanism of FIGS. 15-17 with the depressible member in an engaged position to generally prevent the movable portion from moving away from the flange of the stationary portion.

In FIG. 18A, the teeth 244 of the depressible member 202 are engaged with a section of teeth 96 of the movable portion 42A. As discussed, due in part to the slanted configuration of the teeth 96, 244, the movable portion 42A is not permitted to move away from the flange 46A (FIG. 15) of the stationary portion 40A when the corresponding teeth 96, 244 or other members are engaged with each other. In some embodiments, however, the movable portion 42A can be moved in the opposite direction to generally close the gap between the flange 46A and the head portion 50A of the movable portion 42A, even without the depressible member 202 being manually depressed.

FIGS. 18B and 18C illustrate how the teeth 96 of the movable portion 42A generally interact with the teeth 244 of the depressible member 202 when the movable portion 42A is moved toward or away from the flange 46A of the stationary portion 40A (FIG. 15). In FIG. 18B, the teeth 96 of the movable portion 42A are engaged with the teeth 244 of the depressible member 202. Accordingly, as long as the teeth 96, 244 remain in mated contact with each other, the movable portion 42A can be generally restricted from moving away from the flange 46A of the stationary portion 40A. The shape, size, location, spacing, quantity, orientation and/or other details of the teeth 96, 244 can be different than disclosed herein in order to vary the range over which relative movement between the movable portion 42A and the stationary portion 40A is restricted.

However, as illustrated in FIG. 18C, because of the slanted configuration of the teeth 96, 244, the movable portion 42A can be permitted to move toward the flange 46A of the stationary portion 40A (e.g., in a direction generally represented by arrow 85). In the depicted embodiment, the teeth 96, 244 move along their respective slanted surfaces 97, 245. If the movable portion 42A is moved sufficiently far relative to the depressible member 202, the respective crests 98, 246 of the teeth 96, 244 will move past one another. Thus, the teeth 96 of the movable portion 42A will engage a different section of teeth 244 of the depressible member 202. This can continue until the teeth 244 of the depressible member 202 have moved past the teeth 244 of the movable portion 42A or until the head portion 50A of the movable portion contacts a surface of the rail or the flange 46A of the stationary portion 40A.

Figure 19:
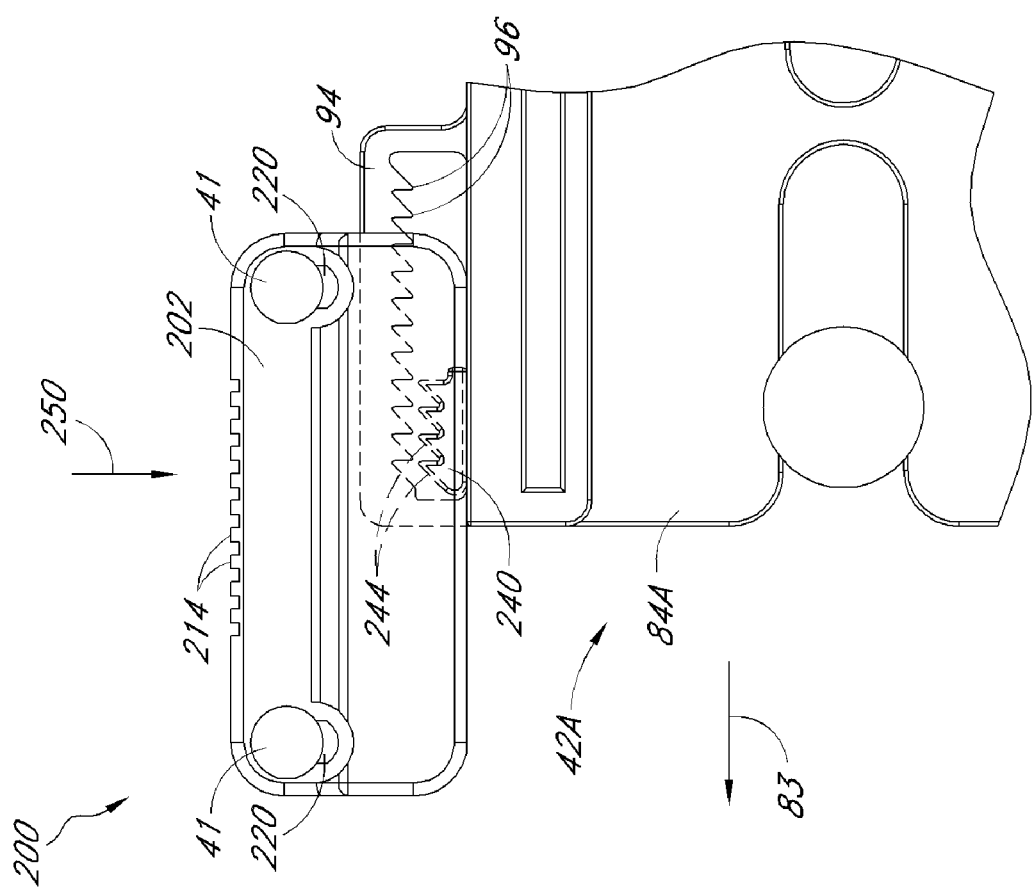
FIG. 19 illustrates an elevation view of the engagement mechanism of FIGS. 15-17 with the depressible member in a disengaged position to generally allow the movable portion to move relative to the stationary portion.

In order to increase the distance between the head portion 50A of the movable portion 42A and the flange 46A of the stationary portion (FIG. 15), the engagement mechanism 200 can manipulated to permit the teeth 96 of the movable portion to disengage from the teeth 244 of the depressible member 202. With reference to FIG. 19, if the depressible member 202 is displaced sufficiently far relative to the movable portion 40A (e.g., in the direction generally represented by arrow 250), the teeth 244 of the depressible member 202 can be moved out of engaging contact with the teeth 96 of the movable portion 42A. Accordingly, as long as the user maintains a necessary minimum force on the depressible member 202 to disengage the teeth 96, 244, the movable portion 42A can be selectively moved away from the flange 46A of the stationary portion 40A. In arrangements that comprise two depressible members 202, such as the one illustrated in FIG. 15, a force may need to be applied to both depressible members 202 in order to permit the movable portion 42A to be moved away from the flange 46A. In one embodiment, the bracket 20A is configured to permit a user to simultaneously press or otherwise manipulate the depressible members 202 using only one hand. For example, as illustrated in FIG. 15, a pair of depressible members 202 may be positioned opposite one another in a vertical direction and aligned with one another in a horizontal direction (relative to the orientation of FIG. 15). Thus, a user may disengage the depressible members 202 simultaneously by using, for example, a thumb on one depressible member 202 and a finger on the other depressible member 202.

With continued reference to FIGS. 18A-18C, the relative movement of the teeth 96, 244 is facilitated by the fact that the vertical position of the depressible member 202 can vary. As discussed herein, a depressible member 202 can be attached to the stationary portion 40A of the bracket 20A using one or more fasteners 41 (e.g., bolts, screws, rivets, etc.) that are situated within slotted openings 220 of the depressible member 202. In addition, as discussed with reference to FIGS. 16A and 16B, the depressible member 202 can be resiliently biased within such slotted openings 220 using one or more springs 234 (FIG. 16B). Thus, the position of the depressible member 202 can change relative to the movable portion 42A, at least to the extent permitted by the available movement of the fasteners 41 within the slotted openings 220. Accordingly, the depressible member 202 can be adapted to move up and/or down as the teeth 96, 244 slide or otherwise move relative to each other.

With reference back to FIG. 15, the movable portion 42A of the bracket 20A can comprise one or more handles 88 or other grasping members that advantageously facilitate the manipulation of the movable portion 42A relative to the stationary portion 40A. Thus, a user can use such a handle 88 when manipulating the engagement mechanism 200 to pull the movable portion 42A against one or more biasing forces (e.g., away from the flange 46A of the stationary portion 40A). As disclosed herein, this can at least temporarily increase the spacing between the head portion 50A and the flange 46A so that a vertical support rail 26 (FIG. 14) can be positioned and subsequently secured therebetween.

As discussed in greater detail herein, once the bracket 20A is properly positioned relative to a support rail, the teeth 96 of the movable portion 42A can be permitted to slide or otherwise move in one direction relative to the adjacent teeth 244 of the depressible member 202 when the head portion 50A if moved toward the flange 46A. Accordingly, the head portion 50A of the movable portion 42A can move toward the flange 46A. Consequently, projections and/or recesses 60A, 62A, 70A, 72A on the flange 46A and the head portion 50A can mate within one or more openings of the support rail. This can advantageously allow a user to secure the bracket 20A to a rail without the use of tools, external fasteners and/or the like. In addition, the engagement mechanisms 200 can help maintain the relative positions of the head portion 50A and the flange 46A so as ensure that the bracket 20A remains secured to the rail or other frame member.

Once a desired gap between the flange 46A of the stationary portion 40A and the head portion 50A of the movable portion 42A has been created (e.g., manipulating the depressible member 202 of each engagement mechanism 200 and simultaneously using the handles 88 to move the movable portion 42A away from the flange 46A), the bracket 20A can be properly aligned with and placed around a desired portion of a vertical support rail. As discussed herein with reference to other embodiments, the rack mount bracket 20A can comprise one or more springs 100 or other biasing members (FIG. 14) that resiliently urge the head portion 50A of the movable portion 42A toward the flange 46A of the stationary portion 40A. Thus, the depressible member 202 or other portion of the engagement mechanism 200 can be subsequently released and the user can move the movable portion 42A toward the flange 46A of the stationary portion 40A, or the user can simply allow the biasing member(s) or spring(s) 100 to move the movable portion 42A toward the stationary portion 40A. Accordingly, the action of such springs 100 or other biasing members can cause the teeth of the movable portion 96 to slidably move past the teeth 244 of the depressible member 202, as discussed herein, until the bracket 20A is secured to the support rail.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In particular, while the present rack mount has been described in the context of particularly preferred embodiments, the skilled artisan will appreciate, in view of the present disclosure, the certain advantages, features and aspects of the rack mount may be realized in a variety of other applications, many of which have been noted above. Additionally, it is contemplated that various aspects and features of the invention described can be practiced separately, combined together, or substituted for one another, and that a variety of combination and sub-combinations of the features and aspects can be made and still fall within the scope of the invention. Thus, it is intended that the scope of the present invention herein disclosed should not be limited by the particular disclosed embodiments described above, but it should be determined only by a fair reading of the claims.

What is claimed is:

1. A bracket for connecting a slide assembly to a frame member having a plurality of openings, the bracket comprising:
   a first portion defining a first surface that is configured to contact the frame member, the first portion being connected to a slide assembly; and
   a second portion defining a second surface that is configured to contact the frame member, said second portion being slidable in a length direction of the bracket relative to said first portion to change a distance between the first and second surfaces;
   wherein said first portion and said second portion cooperate to capture a section of the frame member therebetween; and
   wherein the bracket further comprises:
   a first projection generally extending between the first surface and the second surface, the first projection adapted to engage a first rack hole standard; and
   a second projection that is separate from the first projection and offset from the first projection in a height direction of the bracket, the second projection extending between the first surface and the second surface, the second projection adapted to engage at least a second rack hole standard.

2. The bracket of claim 1, wherein the first projection is carried by the first portion and the second projection is carried by the second portion.

3. The bracket of claim 2, wherein the first projection defines a cavity configured to receive the second projection.

4. The bracket of claim 1, wherein the first projection and the second projection are both carried by the first portion.

5. The bracket of claim 1, wherein the first projection comprises a square projection portion and a cylindrical projection portion extending from the square projection portion.

6. The bracket of claim 1, wherein the first portion of said bracket includes a first section movable relative to a second section, and the first projection is carried by the first section and the second projection is carried by the second section thereby permitting the first projection to be moved relative to the second projection.

7. The bracket of claim 1, wherein the first portion and the second portion are urged toward a closed position relative to one another using at least one biasing member.

8. The bracket of claim 7, further comprising a latch that secures the first and second portions in the closed position.

9. The bracket of claim 7, further comprising an engagement mechanism that is configured to generally maintain the first portion and the second portion in a closed position.

10. The bracket of claim 1, further comprising a third projection and a fourth projection, wherein the first, second, third and fourth projections permit the bracket to be engage with a rack according to any of a square hole, an M6 tapped hole, a 0.25 diameter hole, a 0.281 diameter hole, and a #10 tapped hole standard.

11. A bracket for connecting a slide assembly to a rack having any one of multiple hole standards, the bracket comprising:
    a first portion; and
    a second portion, wherein said first portion and said second portion cooperate to capture a portion of the rack therebetween;
    said second portion further comprising:
    a first section; and
    a second section movable relative to the first section between at least a first position and a second position;
    a first set of projections and a second set of projections, wherein the first set of projections are carried by the first section and the second set of projections are carried by the second section;
    wherein said bracket accommodates a first rack hole standard when said first section is in said first position and said bracket accommodates a second rack hole standard when said first section is in said second position.

12. The bracket of claim 11, further comprising a selector knob that permits said second section to be moved between said first and second positions in order to select between the first rack hole standard and the second rack hole standard.

13. The bracket of claim 11, wherein the second portion is configured to be slidably movable relative to the first portion in a length direction of the bracket.

14. The bracket of claim 13, further comprising a biasing member configured to impart a biasing force that acts to urge the first portion in a closed position with the second portion, so as to generally capture the rack between the first and second portions.

15. The bracket of claim 14, further comprising an engagement mechanism configured to selectively retain a desired spacing between the first portion and the second portion.

16. The bracket of claim 15, wherein the first portion is configured to be released relative to the second portion by moving a depressible member of the engagement mechanism against a resilient force.

17. A method of securing a slide assembly to a frame member, comprising:

providing a bracket member, said bracket member comprising:

a first portion comprising a flange; and a second portion comprising a head, wherein the flange of said first portion and the head of said second portion cooperate to capture a portion of the frame member therebetween;

wherein said bracket is configured to accommodate a first hole standard of the frame member when the head of said second portion is in a first position, and wherein said bracket is configured to accommodate a second hole standard of the frame member when the head of said second portion is in a second position; and wherein the head of said second portion is movable between the first position and the second position using a selector member;

moving the selector member to one of a first and second position to thereby move the head to an appropriate one of the first and second positions depending on a hole standard of the frame member;

aligning the bracket along a desired location of the frame member; and capturing the frame member between the flange and the head by moving the first portion relative to the second portion.

18. The method of claim 17, further comprising moving the second portion relative to the first portion to increase a spacing between the flange of said first portion and the head of said second portion; wherein said relative movement of the first portion and the second portion permits the frame member to be positioned between the first and second portions.

19. The method of claim 18, wherein the bracket further comprises an engagement mechanism, the engagement mechanism being configured to generally prevent movement between the first portion and the second portion in at least a first direction to help ensure that the bracket member remains securely fastened to the frame member.

* * * * *